United States Patent
Saiki et al.

(10) Patent No.: US 10,468,287 B2
(45) Date of Patent: Nov. 5, 2019

(54) PROTECTIVE FILM FORMING FILM, PROTECTIVE FILM FORMING SHEET AND WORK PRODUCT MANUFACTURING METHOD

(71) Applicant: Lintec Corporation, Tokyo (JP)

(72) Inventors: Naoya Saiki, Koshigaya (JP); Daisuke Yamamoto, Kawaguchi (JP); Hiroyuki Yoneyama, Nagareyama (JP); Youichi Inao, Saitama (JP)

(73) Assignee: Lintec Corporation, Tokyo (JP)

( * ) Notice: Subject to any disclaimer, the term of this patent is extended or adjusted under 35 U.S.C. 154(b) by 179 days.

(21) Appl. No.: 15/120,492

(22) PCT Filed: Sep. 3, 2014

(86) PCT No.: PCT/JP2014/073265
§ 371 (c)(1),
(2) Date: Aug. 19, 2016

(87) PCT Pub. No.: WO2015/145807
PCT Pub. Date: Oct. 1, 2015

(65) Prior Publication Data
US 2017/0011949 A1    Jan. 12, 2017

(30) Foreign Application Priority Data
Mar. 24, 2014 (JP) .................. 2014-060938

(51) Int. Cl.
*H01L 21/683* (2006.01)
*B23K 26/53* (2014.01)
(Continued)

(52) U.S. Cl.
CPC .......... *H01L 21/6836* (2013.01); *B23K 26/53* (2015.10); *B32B 27/08* (2013.01);
(Continued)

(58) Field of Classification Search
CPC combination set(s) only.
See application file for complete search history.

(56) References Cited

U.S. PATENT DOCUMENTS

| 2006/0128065 | A1 | 6/2006 | Inada et al. |
| 2011/0057331 | A1* | 3/2011 | Hayashi .............. H01L 21/6836 257/783 |
| 2013/0026648 | A1 | 1/2013 | Hirano et al. |

FOREIGN PATENT DOCUMENTS

| JP | 62-149431 A | 7/1987 |
| JP | 2004-142430 A | 5/2004 |

(Continued)

OTHER PUBLICATIONS

International Search Report for international application No. PCT/JP2014/073265.

(Continued)

*Primary Examiner* — Ratisha Mehta
(74) *Attorney, Agent, or Firm* — Christopher Casieri

(57) ABSTRACT

A protective film forming film 1 is provided in which the product of the breaking stress (MPa) measured at a measurement temperature of 0° C. and the breaking strain (unit: %) measured at a measurement temperature of 0° C. in at least one of the protective film forming film 1 and a protective film formed from the protective film forming film 1 is in a range of 1 MPa·% to 250 MPa·%. According to such a protective film forming film 1, the protective film forming film 1 or the protective film formed from the protective film forming film 1 can be suitably divided in an expanding process performed on a workpiece when the workpiece is divided to obtain a work product.

15 Claims, 1 Drawing Sheet

(51) Int. Cl.
- *B32B 27/08* (2006.01)
- *B32B 27/16* (2006.01)
- *C08J 7/04* (2006.01)
- *C09D 133/10* (2006.01)
- *C09D 163/00* (2006.01)
- *C09D 163/04* (2006.01)
- *C09J 133/10* (2006.01)
- *C09J 163/00* (2006.01)
- *C09J 163/04* (2006.01)
- *H01L 21/268* (2006.01)
- *H01L 21/78* (2006.01)
- *C09J 7/29* (2018.01)

(52) U.S. Cl.
CPC ............... *B32B 27/16* (2013.01); *C08J 7/042* (2013.01); *C09D 133/10* (2013.01); *C09D 163/00* (2013.01); *C09D 163/04* (2013.01); *C09J 7/29* (2018.01); *C09J 133/10* (2013.01); *C09J 163/00* (2013.01); *C09J 163/04* (2013.01); *H01L 21/268* (2013.01); *H01L 21/78* (2013.01); *B32B 2307/50* (2013.01); *B32B 2307/548* (2013.01); *B32B 2457/14* (2013.01); *C08J 2333/10* (2013.01); *C08J 2363/00* (2013.01); *C08J 2363/04* (2013.01); *C09J 2201/28* (2013.01); *C09J 2203/326* (2013.01); *H01L 2221/6834* (2013.01); *H01L 2221/68313* (2013.01); *H01L 2221/68327* (2013.01); *H01L 2221/68336* (2013.01); *H01L 2221/68377* (2013.01)

(56) References Cited

FOREIGN PATENT DOCUMENTS

| | | | |
|---|---|---|---|
| JP | 2006-203133 A | 8/2006 |
| JP | 2007-288170 A | 11/2007 |
| JP | 2009-130320 A | 6/2009 |
| JP | 2010-199541 A | 9/2010 |
| JP | 2011-046963 A | 3/2011 |
| JP | 2011-195712 A | 10/2011 |
| JP | 2012-028396 A | 2/2012 |
| JP | 2012-059769 A | 3/2012 |
| JP | 2012-119468 A | 6/2012 |
| JP | 2012-235168 A | 11/2012 |
| JP | 2013-021221 A | 1/2013 |
| JP | 2013-038408 A | 2/2013 |
| WO | 2004/109786 A1 | 12/2004 |
| WO | 2011/089664 A1 | 7/2011 |
| WO | 2013/172328 A1 | 11/2013 |

OTHER PUBLICATIONS

Office Action for Japanese application 2015-542113 dated Apr. 5, 2016.
Office Action for Japanese application No. 2015-254963 dated Feb. 20, 2018.
Notice of Allowance for Japanese application No. 2016-113001 dated Mar. 13, 2018.
Notice of Allowance for Japanese application No. 2015-254963 dated Feb. 20, 2018.
Decision of Rejection for Japanese application No. 2015-254963 dated Aug. 7, 2018.

\* cited by examiner

PROTECTIVE FILM FORMING FILM, PROTECTIVE FILM FORMING SHEET AND WORK PRODUCT MANUFACTURING METHOD

This application is a 371 of international application No. PCT/JP2014/073265, filed Sep. 3, 2014, which, in turn, claims priority of Japanese Patent Application No.: 2014-060938, filed on Mar. 24, 2014.

TECHNICAL FIELD

The present invention relates to a protective film forming film which is capable of forming a protective film on a workpiece such as a semiconductor wafer or a work product (for example, a semiconductor chip) obtained by processing the workpiece, a protective film forming sheet which includes the protective film forming film, and a method of manufacturing a work product from a workpiece using the protective film forming film.

BACKGROUND ART

In recent years, a semiconductor element has been manufactured by a mounting method referred to as a face-down method. In this method, when a semiconductor chip having a circuit surface on which an electrode such as a bump is formed is mounted, the circuit surface side of the semiconductor chip is bonded to a chip-mounting portion such as a lead frame. Accordingly, the semiconductor element has a structure in which the rear surface side of the semiconductor chip on which a circuit is not formed is exposed.

For this reason, a protective film formed of a hard organic material is frequently formed on the rear surface side of the semiconductor chip for the purpose of protecting the semiconductor chip. The protective film is formed using, for example, a film for a semiconductor rear surface or a dicing sheet-integrated wafer rear surface protective film disclosed in PTL 1 or 2.

CITATION LIST

Patent Literature

[PTL 1] Japanese Unexamined Patent Application, First Publication No. 2012-28396
[PTL 2] Japanese Unexamined Patent Application, First Publication No. 2012-235168

SUMMARY OF INVENTION

Technical Problem

When a work product formed of a strip such as a semiconductor chip is manufactured from a workpiece such as a semiconductor wafer, in the related art, blade dicing processing of cutting a workpiece with a rotary blade while spraying a liquid for the purpose of washing the workpiece to obtain a strip is usually performed. However, in recent years, stealth dicing (registered trademark) processing, which is a dry process and capable of dividing a workpiece to strips, has been employed. In the stealth dicing (registered trademark) processing, a workpiece is irradiated with laser beams having a large numerical aperture (NA) such that a modified layer is preliminarily formed in the inside of the workpiece while damage to the vicinity of the surface of the workpiece is minimized. Subsequently, in an expanding process or the like, a force is applied to the workpiece and a work product formed of a strip is obtained.

In a case where the above-described protective film or a protective film forming film which is capable of forming a protective film is laminated on a workpiece, it is necessary for these films to be suitably divided such that the protective film or the protective film forming film which is capable of forming a protective film is also laminated on a work product formed by performing dividing processing on the workpiece.

The present invention has been made in consideration of the above-described problems, and an object thereof is to provide a protective film forming film in which a protective film forming film or a protective film formed from the protective film forming film can be suitably divided in an expanding process performed on a workpiece at the time of obtaining a work product by performing dividing processing on the workpiece. Another object thereof is to provide a method of manufacturing a work product using the above-described protective film forming film.

Solution to Problem

In order to achieve the above-described objects, as a result of research conducted by the present inventors, it was possible to obtain new knowledge that the product of the breaking stress (MPa) measured at a measurement temperature of 0° C. and the breaking strain (unit: %) measured at a measurement temperature of 0° C. in a protective film forming film and a protective film formed from the protective film forming film for an expanding process is in a range of 1 MPa·% to 250 MPa·% and thus the protective film forming film or the protective film is easily and suitably divided in an expanding process.

The present invention completed by the above-described findings is as follows.

(1) A protective film forming film, in which the product of the breaking stress (MPa) measured at a measurement temperature of 0° C. and the breaking strain (unit: %) measured at a measurement temperature of 0° C. in at least one of the protective film forming film and a protective film formed from the protective film forming film is in a range of 1 MPa·% to 250 MPa·%.

(2) The protective film forming film according to (1), in which the light transmittance at a wavelength of 1064 nm is 30% or greater.

(3) A protective film forming sheet, including: a dicing sheet which includes a base material and an adhesive layer laminated on one surface side of the base material; and the protective film forming film according to (1) or (2) which is laminated on the adhesive layer side of the dicing sheet.

(4) The protective film forming sheet according to (3), in which the light transmittance at a wavelength of 1064 nm is 30% or greater.

(5) A method of manufacturing a work product, including: a first modified layer forming process of forming a modified layer in the inside of a workpiece by irradiating the workpiece with laser beams in the infrared region such that the laser beams are focused on a focal point set in the inside of the workpiece; a first protective film forming film laminating process of laminating the protective film forming film according to (1) on the surface of the workpiece on which the modified layer is formed; a dividing process of dividing the workpiece by applying a force to the workpiece on which the modified layer is formed to obtain a divided product; and a protective film forming process of forming a protective film from the protective film forming film, in which a work product formed by laminating the protective film on one surface of the divided product is obtained.

(6) A method of manufacturing a work product, including: a third modified layer forming process of forming a modified layer in the inside of a workpiece by irradiating the workpiece of a laminated structure, which includes the workpiece, the protective film forming film according to (2) which is laminated on one surface of the workpiece, and a dicing sheet laminated on a surface side opposite to a side of the protective film forming film facing the workpiece, with laser beams in the infrared region from the dicing sheet side such that the laser beams are focused on a focal point set in the inside of the workpiece; a dividing process of dividing the workpiece by applying a force to the workpiece on which the modified layer is formed to obtain a divided product; and a protective film forming process of forming a protective film from the protective film forming film, in which a work product formed by laminating the protective film on one surface of the divided product is obtained.

(7) A method of manufacturing a work product, including: a second protective film forming film laminating process of laminating the protective film forming film according to (2) on one surface of a workpiece; a second modified layer forming process of forming a modified layer in the inside of the workpiece by irradiating the workpiece through the protective film forming film with laser beams in the infrared region such that the laser beams are focused on a focal point set in the inside of the workpiece on which the protective film forming film is laminated; a dividing process of dividing the workpiece by applying a force to the workpiece on which the modified layer is formed to obtain a divided product; and a protective film forming process of forming a protective film from the protective film forming film, in which a work product formed by laminating the protective film on one surface of the divided product is obtained.

(8) The method of manufacturing a work product according to any one of (5) to (7), in which a first dicing sheet laminating process of laminating the dicing sheet on the protective film forming film laminated on the workpiece is performed before the dividing process.

(9) The method of manufacturing a work product according to (5) or (6), in which the protective film forming film laminated on the workpiece is in a state in which the dicing sheet is laminated on one surface thereof.

(10) The method of manufacturing a work product according to any one of (5) to (9), in which the protective film forming process is performed after the dividing process.

(11) The method of manufacturing a work product according to any one of (5) to (9), in which the dividing process is performed after the protective film forming process.

(12) A method of manufacturing a work product, including: a second protective film forming film laminating process of laminating the protective film forming film according to (2) on one surface of a workpiece; a protective film forming process of forming a protective film from the protective film forming film; a fourth modified layer forming process of forming a modified layer in the inside of the workpiece by irradiating the workpiece through the protective film with laser beams in the infrared region such that the laser beams are focused on a focal point set in the inside of the workpiece on which the protective film is laminated; and a dividing process of dividing the workpiece by applying a force to the workpiece on which the modified layer is formed to obtain a divided product, in which a work product formed by laminating the protective film on one surface of the divided product is obtained as a resultant of the dividing process.

(13) A method of manufacturing a work product, including: a second protective film forming film laminating process of laminating the protective film forming film according to (2) on one surface of a workpiece; a protective film forming process of forming a protective film from the protective film forming film; a second dicing sheet laminating process of laminating a dicing sheet on the protective film laminated on the workpiece; a fifth modified layer forming process of forming a modified layer in the inside of the workpiece by irradiating the workpiece through the protective film and the dicing sheet with laser beams in the infrared region such that the laser beams are focused on a focal point set in the inside of the workpiece on which the protective film is laminated; and a dividing process of dividing the workpiece by applying a force to the workpiece on which the modified layer is formed to obtain a divided product, in which a work product formed by laminating the protective film on one surface of the divided product is obtained as a resultant of the dividing process.

(14) A method of manufacturing a work product, including: a third protective film forming film laminating process of laminating the protective film forming film according to (2), in a state in which a dicing sheet is laminated thereon, on one surface of a workpiece; a protective film forming process of forming a protective film from the protective film forming film; a fifth modified layer forming process of forming a modified layer in the inside of the workpiece by irradiating the workpiece through the protective film and the dicing sheet with laser beams in the infrared region such that the laser beams are focused on a focal point set in the inside of the workpiece on which the protective film is laminated; and a dividing process of dividing the workpiece by applying a force to the workpiece on which the modified layer is formed to obtain a divided product, in which a work product formed by laminating the protective film on one surface of the divided product is obtained as a resultant of the dividing process.

Advantageous Effects of Invention

According to the protective film forming film and the protective film forming sheet of the present invention, it is possible to obtain a protective film forming film or a protective film which is suitably divided in the expanding process. Therefore, according to the method of manufacturing a work product using such a protective film forming film, division failure is unlikely to occur when a work product is obtained by performing dividing processing on a workpiece on which the protective film forming film or the protective film is laminated.

DESCRIPTION OF EMBODIMENTS

Figure 1:
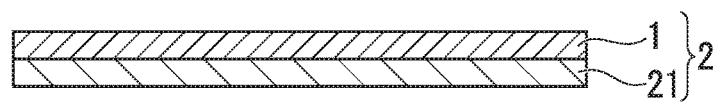
FIG. 1 is a sectional view illustrating a protective film forming sheet according to an embodiment of the present invention.

Hereinafter, embodiments of the present invention will be described.

1. Protective Film Forming Film

A protective film forming film according to the present embodiment is used for forming a protective film on a workpiece or a work product obtained by processing the workpiece. The protective film is formed of a protective film forming film, preferably, a cured protective film forming film. A semiconductor wafer is exemplified as a workpiece and a semiconductor chip is exemplified as a work product obtained by processing the workpiece, but the present invention is not limited thereto. Further, in a case where the workpiece is a semiconductor wafer, a protective film is formed on the rear surface side (side on which an electrode such as a bump is not formed) of the semiconductor wafer.

(1) Physical Properties (1-1) Breaking Index

The product of the breaking stress (MPa) measured at a measurement temperature of 0° C. and the breaking strain (unit: %) measured at a measurement temperature of 0° C. in the protective film forming film or the protective film (in the present specification, a protective film forming film and a protective film are also collectively referred to as a "protective film or the like") formed from the protective film forming film according to the present embodiment (in the present specification, this product is also referred to as a "breaking index") is in a range of 1 MPa·% to 250 MPa·%.

The breaking stress (MPa) of the protective film or the like according to the present embodiment, which is measured at a measurement temperature of 0° C., is more preferably in a range of 1 MPa to 100 MPa and particularly preferably in a range of 5 MPa to 45 MPa.

The breaking strain (unit: %) of the protective film or the like according to the present embodiment, which is measured at a measurement temperature of 0° C., is more preferably in a range of 0.5% to 100% and particularly preferably in a range of 2% to 25%.

In a case where an object to be cut during the expanding process is a protective film forming film, the breaking index of the protective film forming film may satisfy the above-described conditions. In a case where an object to be cut is a protective film formed from the protective film forming film, the breaking index of the protective film may satisfy the above-described conditions. That is, when a workpiece is divided, a protective film forming film or a protective film which is an object to be divided together with the workpiece may satisfy the above-described conditions related to the breaking index. Therefore, it is not necessary that both of the protective film forming film and the protective film formed from the protective film forming film satisfy the conditions of the breaking index described above. Both of the protective film forming film and the protective film formed from the protective film forming film may satisfy the conditions of the breaking index described above.

The protective film or the like is easily divided when the breaking strain thereof is small. However, in a case where the breaking stress thereof is extremely large even if the breaking strain of the protective film or the like is small, the protective film or the like is not uniformly expanded even when the protective film or the like is expanded by carrying out the expanding process, and the protective film or the like is occasionally not broken. In a case where the breaking strain of the protective film or the like is extremely large even if the breaking stress thereof is small, the protective film or the like is uniformly expanded during the expanding process, but the expansion does not result in breakage in some cases. Accordingly, when the breaking index of the protective film or the like is in an appropriate range, the protective film or the like can be cut in a well-balanced manner.

In a case where the breaking index of the protective film or the like is greater than 250 MPa·%, there is a concern that the protective film or the like may not be divided by the expanding process. In a case where the breaking index of the protective film or the like is less than 1 MPa·%, there is a concern that portions other than the target division line of the protective film forming layer may be broken. The breaking index of the protective film or the like according to the present embodiment is more preferably in a range of 2 MPa·% to 220 MPa·% and particularly preferably in a range of 3 MPa·% to 200 MPa·%.

(1-2) Light Transmittance

According to the present embodiment, the light transmittance of the protective film forming film at a wavelength of 1064 nm is preferably 30% or greater. The light transmittance in the present specification is a value measured using an integrating sphere, and a spectrophotometer is used as a measuring instrument.

In a case where a protective film forming film is adhered to a modified layer after the modified layer is formed in the inside of a workpiece such as a semiconductor wafer, the light transmittance of the protective film forming film at a wavelength of 1064 nm is not limited.

In a case where a modified layer is formed on a workpiece such as a semiconductor wafer after a protective film forming film is adhered to the workpiece, the light transmittance of the protective film forming film at a wavelength of 1064 nm is preferably in a range of 30% to 99%, more preferably in a range of 40% to 98%, and particularly preferably in a range of 45% to 97%. In the above-described case, when the light transmittance of the protective film or the like, which is adhered to one surface of the workpiece, for example, a rear surface of a semiconductor wafer, at a wavelength of 1064 nm is 30% or less, a modified layer is not easily formed in the inside of the workpiece through irradiation with laser. In a case where the light transmittance of the protective film or the like at a wavelength of 1064 nm is 99% or greater, there is a concern that a device may not recognize whether the protective film is adhered to the surface of the workpiece when laser irradiation is performed for the purpose of forming a modified layer in the workpiece.

Further, in a case where the protective film forming film is formed of an uncured curable adhesive, the light transmittance of the protective film forming film almost does not change before or after the curing. Accordingly, when the light transmittance of the protective film forming film at a wavelength of 1064 nm before curing is 30% or greater, the light transmittance of the protective film at a wavelength of 1064 nm, obtained by the protective film forming film being cured, also becomes 30% or greater.

After a protective film forming film or a dicing sheet is separately adhered or a protective film forming film and dicing sheet are adhered, in order to form a modified layer in a workpiece, the light transmittance at a wavelength of 1064 nm of not a single protective film or the like but a laminate of a protective film or the like and a dicing sheet is preferably in a range of 30% to 99%, more preferably in a range of 45% to 98%, and particularly preferably in a range of 55% to 97%.

Here, the protective film forming film according to the present embodiment may be formed of a single layer or a plurality of layers, but it is preferable that the protective film forming film be formed of a single layer in terms of ease of controlling the light transmittance and production cost. In a case where the protective film forming film is formed of a plurality of layers, it is preferable to satisfy the above-described light transmittance for the entirety of the plurality of layers in terms of ease of controlling light transmittance.

(2) Material

It is preferable that the protective film forming film be formed of an uncured curable adhesive. In this case, a protective film can be firmly adhered to a workpiece and the protective film having durability can be laminated on a divided product such as a chip by overlapping the workpiece with the protective film forming film and then curing the protective film forming film.

It is preferable that the protective film forming film have tackiness at room temperature or exhibit tackiness by being heated. In this manner, when a workpiece overlaps the protective film forming film as described above, the protective film forming film and the workpiece can be adhered to each other. Accordingly, positioning can be reliably performed before the protective film forming film is cured.

It is preferable that the curable adhesive constituting the protective film forming film having the above-described characteristics contain a curable component and a binder polymer component. A thermosetting component, an energy ray-curable component, or a mixture of these can be used as the curable component, but a thermosetting component is particularly preferable.

Examples of the thermosetting component include an epoxy resin, a phenolic resin, a melamine resin, a urea resin, a polyester resin, a urethane resin, an acrylic resin, a polyimide resin, a benzoxazine resin, and a mixture of these. Among these, an epoxy resin, a phenolic resin, or a mixture of these is preferable.

An epoxy resin has properties of being three-dimensionally reticulated and forming a strong coating film when heated. As such an epoxy resin, various known epoxy resins of the related art can be used, but, normally, an epoxy resin having a molecular weight of approximately 300 to 2000 is preferable and an epoxy resin having a molecular weight of 300 to 500 is particularly preferable. Further, it is preferable that a liquid epoxy resin in a normal state in which the molecular weight is in a range of 330 to 400 and a solid epoxy resin at room temperature in which the molecular weight is in a range of 400 to 2500 and particularly in a range of 500 to 2000 be blended with each other and then used. Moreover, it is preferable that the epoxy equivalent of the epoxy resin be in a range of 50 g/eq to 5000 g/eq.

Specific examples of such an epoxy resin include glycidyl ether of phenols such as bisphenol A, bisphenol F, resorcinol, phenyl novolac, or cresol novolac; glycidyl ether of alcohols such as butanediol, polyethylene glycol, or polypropylene glycol; glycidyl ether of carboxylic acid such as phthalic acid, isophthalic acid, or tetrahydrophthalic acid; a glycidyl type or alkyl glycidyl type epoxy resin in which active hydrogen bonded to a nitrogen atom such as aniline isocyanurate is substituted with a glycidyl group; and so-called alicyclic epoxide in which epoxy is introduced by, for example, oxidizing a carbon-carbon double bond in a molecule such as vinyl cyclohexane diepoxide, 3,4-epoxycyclohexylmethyl-3,4-dicyclohexanecarboxylate, or 2-(3,4-epoxy)cyclohexyl-5,5-spiro(3,4-epoxy)cyclohexane-m-dioxane. In addition, it is possible to use an epoxy resin having a biphenyl skeleton, a dicyclohexanediene skeleton, or a naphthalene skeleton.

Among these, a bisphenol-based glycidyl type epoxy resin, an o-cresol novolac type epoxy resin, and a phenol novolac type epoxy resin is preferably used. These epoxy resins may be used alone or in combination of two or more kinds thereof.

In a case of using an epoxy resin, it is preferable to use a thermally-active latent epoxy resin-curing agent as an auxiliary agent. The thermally-active latent epoxy resin-curing agent is a curing agent which does not react with an epoxy resin at room temperature, and instead reacts with an epoxy resin by being activated when heated at a certain temperature or higher. Examples of the method of activating a thermally-active latent epoxy resin-curing agent include a method of generating active species (an anion and a cation) through a chemical reaction when heated; a method of stably dispersing a curing agent in an epoxy resin at around room temperature, allowing the curing agent to be compatible with and dissolved in the epoxy resin at a high temperature, and starting a curing reaction; a method of performing elution at a high temperature using a molecular sieve-enclosed type curing agent and starting a curing reaction; and a method of using a microcapsule.

Specific examples of the thermally-active latent epoxy resin-curing agent include a high-melting-point active hydrogen compound such as various onium salts, a dibasic acid dihydrazide compound, dicyandiamide, an amine adduct curing agent, or an imidazole compound. These thermally-active latent epoxy resin-curing agents can be used alone or in combination of two or more kinds thereof. The content of the above-described thermally-active latent epoxy resin-curing agent is preferably in a range of 0.1 parts by weight to 20 parts by weight, particularly preferably in a range of 0.2 parts by weight to 10 parts by weight, and more preferably in a range of 0.3 parts by weight to 5 parts by weight with respect to 100 parts by weight of an epoxy resin.

As a phenolic resin, a condensate of phenols such as alkyl phenol, polyhydric phenol, and naphthol and aldehydes is used without any particular limitation. Specific examples thereof include a phenol novolac resin, an o-cresol novolac resin, a p-cresol novolac resin, a t-butyl phenol novolac resin, a dicyclopentadiene cresol resin, a polyparavinyl phenol resin, a bisphenol A type novolac resin, and a modified product of these.

A phenolic hydroxyl group contained in the phenolic resin can form a cured product having high impact resistance by easily performing an addition reaction with an epoxy group of the epoxy resin when heated. For this reason, an epoxy resin and a phenolic resin may be used together.

A binder polymer component provides moderate tack for the protective film forming film and improves operability of a protective film forming sheet 3. The weight-average molecular weight of the binder polymer is normally in a range of 50000 to 2000000, preferably in a range of 100000 to 1500000, and particularly preferably in a range of 200000 to 1000000. Film formation of a protective film forming film becomes insufficient when the molecular weight thereof is extremely small and compatibility with other components becomes poor, and additionally, uniform film formation is hindered when the molecular weight thereof is extremely large. Examples of such a binder polymer include an acrylic polymer, a polyester resin, a phenoxy resin, a urethane resin, a silicone resin, and a rubber polymer. Among these, an acrylic polymer is preferably used.

As the acrylic polymer, a (meth)acrylic acid ester copolymer formed of constituent units derived from a (meth) acrylic acid ester monomer and a (meth)acrylic acid derivative is exemplified. Here, preferred examples of the (meth) acrylic acid ester monomer include (meth)acrylic acid alkyl ester having 1 to 18 carbon atoms of an alkyl group such as methyl (meth)acrylate, ethyl (meth)acrylate, propyl (meth) acrylate, or butyl (meth)acrylate. Further, examples of the (meth)acrylic acid derivative include (meth)acrylic acid, glycidyl (meth)acrylate, and hydroxyethyl (meth)acrylate.

When a glycidyl group is introduced to an acrylic polymer using glycidyl methacrylate or the like from the examples described above as a constituent unit, compatibility with an epoxy resin as the above-described thermosetting component is improved, the glass transition temperature (Tg) after the protective film forming film is cured is increased, and heat resistance is improved. When a hydroxyl group is introduced to an acrylic polymer using hydroxyethyl acrylate or the like as a constituent unit from the examples described above, adhesiveness or adhesion properties to a workpiece can be controlled.

The weight-average molecular weight of the polymer in a case of using an acrylic polymer as a binder polymer is preferably 100000 or greater and particularly preferably 150000 to 1000000. The glass transition temperature of the acrylic polymer is normally 20° C. or lower and preferably in a range of approximately −70° C. to 0° C. The acrylic polymer has tackiness at room temperature (23° C.).

In the blending ratio of the thermosetting component and the binder polymer component, the content of the thermosetting component is preferably in a range of 50 parts by weight to 1500 parts by weight, particularly preferably in a range of 70 parts by weight to 1000 parts by weight, and more preferably in a range of 80 parts by weight to 800 parts by weight with respect to 100 parts by weight of the binder polymer component. When the thermosetting component is mixed with the binder polymer component at such a ratio, moderate tack is shown before curing while satisfying the conditions of the breaking index described above in at least one of the states before and after the curing and an adhering operation can be stably performed, thereby obtaining a protective film with excellent film strength after curing.

It is preferable that the protective film forming film contain a colorant and/or a filler. In the case where the protective film forming film contains a filler, it is easy for the protective film or the like to satisfy the conditions of the breaking index described above by adjusting the type or the blending amount of the filler. In the case where the protective film contains both of a colorant and a filler, it is easy to control the light transmittance at a wavelength of 1064 nm to be in the above-described range. Further, when the protective film forming film contains a filler, the hardness of the protective film after curing can be maintained to be high and moisture resistance can be improved. Moreover, when the protective film forming film contains a filler, the thermal expansion coefficient of the protective film can be set to be closer to the thermal expansion coefficient of a workpiece such as a semiconductor wafer, and thus warpage of the workpiece during the processing can be reduced.

As the colorant, a known colorant such as an inorganic pigment, an organic pigment, or an organic dye can be used, and it is preferable that the colorant contain an organic colorant, from the viewpoint of improving controllability of light transmittance. From the viewpoint of improving chemical stability of the colorant (specifically, unlikeliness of elution, unlikeliness of color transfer occurring, or lack of change with time is exemplified), it is preferable that the colorant be formed of a pigment. Accordingly, it is preferable that the colorant contained in the protective film forming film according to the present embodiment be formed of an organic pigment.

Examples of the organic pigment and the organic dye serving as an organic colorant include an aluminum-based pigment, a cyanine-based pigment, a merocyanine-based pigment, a croconium-based pigment, a squarylium-based pigment, an azulenium-based pigment, a polymethine-based pigment, a naphthoquinone-based pigment, a pyrylium-based pigment, a phthalocyanine-based pigment, a naphthalocyanine-based pigment, a naphtholactam-based pigment, an azo-based pigment, a condensed azo-based pigment, an indigo-based pigment, a perinone-based pigment, a perylene-based pigment, a dioxazine-based pigment, a quinacridone-based pigment, an isoindolinone-based pigment, a qinophthalone-based pigment, a pyrrole-based pigment, a thioindigo-based pigment, a metal complex-based pigment (metal complex dye), a dithiol metal complex-based pigment, an indole phenol-based pigment, a triallylmethane-based pigment, an anthraquinone-based pigment, a dioxazine-based pigment, a naphthol-based pigment, an azomethine-based pigment, a benzimidazolone-based pigment, a pyranthrone-based pigment, and a threne-based pigment.

The organic colorant may be formed of one material or plural kinds of materials. From the viewpoint of easily setting the light transmittance at a wavelength of 1064 nm to 30% or greater, it is preferable that the colorant contained in the protective film forming film according to the present embodiment be formed of plural kinds of materials.

For example, when a isoindolinone-based pigment which is a yellow pigment, a phthalocyanine-pigment which is a blue pigment, and diketopyrrolopyrrole which is a red pigment are mixed with each other in suitable proportions, the light transmittance of the protective film or the like at a wavelength of 1064 nm can be easily set to 30% or greater.

Examples of the inorganic pigment include carbon black, a cobalt-based pigment, an iron-based pigment, a chromium-based pigment, a titanium-based pigment, a vanadium-based pigment, a zirconium-based pigment, a molybdenum-based pigment, a ruthenium-based pigment, a platinum-based pigment, an indium tin oxide (ITO)-based pigment, and an antimony tin oxide (ATO)-based pigment.

The colorant in the protective film forming film according to the present embodiment may be formed of an organic colorant and an inorganic colorant.

In view of the thickness of the protective film forming film, it is preferable that the amount of the colorant to be mixed in the protective film Banning film be appropriately set such that the light transmittance of the protective film forming film at a wavelength of 1064 nm is 30% or greater. In a case where the amount of the colorant to be mixed in the protective film forming film is extremely large, since there may be a tendency that other properties of the protective film forming film, for example, adhesion to a workpiece, are degraded, it is preferable that the amount of the colorant to be mixed in the protective film forming film be set to be the above-described range, from the above-described viewpoints.

The average particle diameter of the colorant is not limited. It is preferable that the average particle diameter thereof be set such that the light transmittance of the protective film forming film at a wavelength of 1064 nm is 30% or greater. In a case where the average particle diameter of the colorant is extremely large, there may be a tendency that the light transmittance is unlikely to be increased regardless of the wavelength. In a case where the average particle diameter of the colorant is extremely small, there is a high possibility that secondary problems, for example, difficulty in obtaining such a colorant or degradation of handleability, may be generated. Therefore, the average particle diameter of the colorant is preferably in a range of 1 nm to 500 nm, particularly preferably in a range of 3 nm to 100 nm, and more preferably in a range of 5 nm to 50 nm. Further, the average particle diameter of the colorant in the present specification is set to be a value measured using a particle size distribution-measuring device (Nanotrac Wave-UT151, manufactured by NIKKISO CO., LTD.) according to a dynamic light scattering method.

Examples of the filler include silica such as crystalline silica, fused silica, or synthetic silica; and an inorganic filler such as alumina or a glass balloon. Among these, silica is preferable, synthetic silica is more preferable, and particularly synthetic silica in which radiation sources of α-rays which become a factor of malfunction of a semiconductor element are removed as much as possible is optimal. Examples of the shape of the filler include a spherical shape, a needle-like shape, and an amorphous shape. Among these, a spherical shape is preferable, and a true spherical shape is particularly preferable. When the filler particles have a spherical or true spherical shape, the diffused reflection of light beams is unlikely to occur, and the profile of the light transmittance spectrum of the protective film forming film is easily controlled.

Further, as a filler to be added to the protective film forming film, a functional filler may be mixed in addition to the above-described inorganic filler. Examples of the functional filler include a conductive filler such as gold, silver, copper, nickel, aluminum, stainless steel, carbon, or ceramic or a conductive filler such as silver-plated nickel or silver-plated aluminum, used for providing conductivity after die bonding; and a thermal conductive filler of a metal material such as gold, silver, copper, nickel, aluminum, stainless steel, silicon, or germanium or an alloy of these, used for providing thermal conductivity.

The average particle diameter of a filler (particularly a silica filler) is preferably in a range of 0.01 μm to 10 μm, more preferably in a range of 0.01 μm to 3 μm, particularly preferably in a range of 0.03 μm to 2 μm, and still more preferably in a range of 0.05 μm to 1 μm. When the average particle diameter of the filler is 0.01 μm or greater, the light transmittance at a wavelength of 550 nm is easily controlled to be 20% or less such that grinding marks in the semiconductor chip or the like cannot be detected by visual observation. When the average particle diameter of the filler exceeds 10 μm, the surface state of the protective film forming film may become worse. In addition, when the average particle diameter of the filler exceeds 3 μm, it is occasionally difficult to control the profile of the light transmittance spectrum of the protective film forming film, due to the diffused reflection of infrared rays. Further, the average particle diameter of less than 1 μm of the filler in the present specification is set to be a value measured using a particle size distribution-measuring device (Nanotrac Wave-UT151, manufactured by NIKKISO CO., LTD.) according to a dynamic light scattering method. Moreover, the average particle diameter of 1 μm or greater of the filler is set to be a value measured using a particle size distribution-measuring device (Microtrac MT3000II, manufactured by NIKKISO CO., LTD.) according to a laser diffraction scattering method.

From the viewpoint of easily satisfying the above-described conditions of the breaking index, the amount of the filler (particularly a silica filler) to be mixed in the protective film forming film is preferably in a range of 10% by mass to 80% by mass, particularly preferably in a range of 20% by mass to 70% by mass, and more preferably in a range of 30% by mass to 65% by mass.

The protective film forming film may contain a coupling agent. When the protective film forming film contains a coupling agent, the adhesiveness and adherence between the protective film and the workpiece can be improved and the moisture resistance (moist-heat resistance) can be improved without damaging the heat resistance of the protective film after the protective film forming film is cured. As the coupling agent, a silane coupling agent is preferable because of versatility thereof and cost benefits.

Examples of the silane coupling agent include γ-glycidoxypropyltrimethoxysilane, γ-glycidoxypropylmethyldiethoxysilane, β-(3,4-epoxycyclohexyl)ethyltrimethoxysilane, γ-(methacryloxypropyl)trimethoxysilane, γ-aminopropyltrimethoxysilane, N-6-(aminoethyl)-γ-aminopropyltrimethoxysilane, N-6-(aminoethyl)-γ-aminopropylmethyldiethoxysilane, N-phenyl-γ-aminopropyltrimethoxysilane, γ-ureidopropyltrimethoxysilane, γ-mercaptopropyltrimethoxysilane, γ-mercaptopropylmethyldimethoxysilane, bis(3-triethoxysilylpropyl)tetrasulfane, methyl trimethoxy silane, methyl triethoxy silane, vinyl trimethoxy silane, vinyl triacethoxy silane, and imidazole silane. These may be used alone or in combination of two or more kinds thereof.

For the purpose of adjusting cohesive strength before curing, the protective film forming film may contain a crosslinking agent such as an organic polyvalent isocyanate compound, an organic polyvalent imine compound, or an organic metal chelate compound. In addition, for the purpose of suppressing static electricity and improving reliability of a chip, the protective film forming film may contain an antistatic agent. Moreover, for the purpose of increasing flame retardancy of the protective film and improving reliability as a package, the protective film forming film may contain a flame retardant such as a phosphoric acid compound, a bromine compound, or a phosphorus compound.

The thickness of the protective film forming film is preferably in a range of 3 μm to 300 μm, particularly preferably in a range of 5 μm to 200 μm, and more particularly preferably in a range of 7 μm to 100 μm, in order to effectively exhibit functions as a protective film formed from the protective film forming film.

2. Protective Film Forming Sheet 2

FIG. 1 is a sectional view illustrating a protective film forming sheet according to an embodiment of the present invention. As illustrated in FIG. 1, a protective film forming sheet 2 according to the present embodiment includes a protective film forming film 1 and a release sheet 21 laminated on one surface (surface on the lower side of FIG. 1) of the protective film forming film 1. However, the release sheet 21 is released when the protective film forming sheet 2 is used.

The release sheet 21 is used to protect the protective film forming film 1 during the time when the protective film forming sheet 2 is to be used and may not necessarily be present. The configuration of the release sheet 21 is optional, and a plastic film in which the film itself has release properties with respect to the protective film forming film 1 and a film in which a plastic film is subjected to a release treatment using a release agent or the like are exemplified. Specific examples of the plastic film include a polyester film such as polyethylene terephthalate, polybutylene terephthalate, or polyethylene naphthalate; and a polyolefin film such as polypropylene or polyethylene. As the release agent, a silicone-based agent, a fluorine-based agent, a long chain alkyl-based agent, or the like can be used. Among these, a silicone-based agent in which stabilized performance can be obtained at a low coast is preferable. The thickness of the release sheet 21 is not particularly limited, but normally in a range of approximately 20 μm to 250 μm.

The above-described release sheet 21 may be laminated on another surface (surface on the upper side of FIG. 1) of the protective film forming film 1. In this case, it is preferable that a tight peeling type release sheet be obtained by increasing the release force of one release sheet 21 and an easy peeling type release sheet be obtained by decreasing the release force of another release sheet 21.

In order to produce the protective film forming sheet 2 according to the present embodiment, the protective film forming film 1 is formed on the release surface (surface having release properties: normally a surface subjected to a release treatment, but not limited thereto) of the release sheet 21. Specifically, a curable adhesive that constitutes the protective film forming film 1 and a coating agent for a protective film forming film that further contains a solvent, if desired, are prepared and the release surface of the release sheet 21 is coated with the curable adhesive and the coating agent using a coating machine such as a roll coater, a knife coater, a roll knife coater, an air knife coater, a die coater, a bar coater, a gravure coater, or a curtain coater and then dried, thereby forming the protective film forming film 1.

A method of producing a chip, on which a protective film as a work product is laminated, from a semiconductor wafer serving as a workpiece, as an example, using the protective film forming sheet 2 according to the present embodiment will be described below. First, the protective film forming film 1 of the protective film forming sheet 2 is adhered to the rear surface of the semiconductor wafer of which the surface is formed with a circuit and on which back-grinding processing is performed. At this time, tackiness can be exhibited by heating the protective film forming film 1, if desired.

Next, the release sheet 21 is released from the protective film forming film 1. Next, a protective film is formed by curing the protective film forming film 1, thereby obtaining a semiconductor wafer on which a protective film is laminated. In a case where the protective film forming film 1 is a thermosetting adhesive, the protective film forming film 1 may be heated at a predetermined temperature for an appropriate amount of time. In addition, the protective film forming film 1 may be cured after a dicing process is performed.

When the semiconductor wafer on which a protective film is laminated is obtained in this manner, the protective film is irradiated with laser beams, if desired, and laser printing is performed. Further, the laser printing may be performed before the protective film forming film 1 is cured.

Next, the semiconductor wafer on which the protective film subjected to laser printing is laminated is disposed in a laser irradiation device for division processing, the position of the surface of the semiconductor wafer covered with the protective film is detected, and a modified layer is formed in the semiconductor wafer using laser for processing. Here, the protective film forming film 1 according to the present embodiment satisfies the conditions of the light transmittance described above, a modified layer can be easily formed even when laser beams applied from the laser for processing is applied to the semiconductor wafer 6 through the protective film.

A dicing sheet is adhered to the surface of the protective film side of a laminate formed of the protective film and the semiconductor wafer having the modified layer, obtained in the above-described manner, formed therein. In addition, a force (tensile strength in the in-plane direction of the main surface) is applied to the semiconductor wafer 6, on which the protective film is laminated, by performing an expanding process of expanding the dicing sheet. As a result, the laminate adhered to the dicing sheet is divided and a chip on which the protective film is laminated is obtained. Thereafter, the chip on which the protective film is laminated is picked up from the dicing sheet using a pick-up device.

3. Other Protective Film Forming Sheets 3

Figure 2:
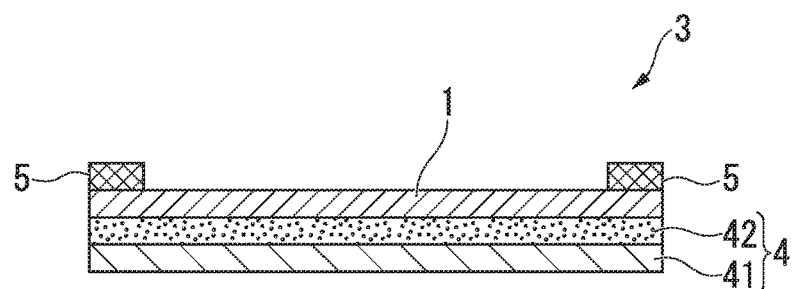
FIG. 2 is a sectional view illustrating a protective film forming sheet according to another embodiment of the present invention.

FIG. 2 is a sectional view of a protective film forming sheet according to another embodiment of the present invention. As illustrated in FIG. 2, the protective film forming sheet 3 according to the present embodiment includes a dicing sheet 4 formed by laminating an adhesive layer 42 on one surface of a base material 41; the protective film forming film 1 laminated on the adhesive layer 42 side of the dicing sheet 4; and an adhesive layer 5 for a jig laminated on a peripheral edge on the opposite side of the dicing sheet 4 in the protective film forming film 1. The adhesive layer 5 for a jig is a layer used for bonding the protective film forming sheet 3 to a jig such as a ring frame.

The protective film forming sheet 3 according to the present embodiment is used for being adhered to a workpiece and holding the workpiece when the workpiece is processed and for forming a protective film on the workpiece or a work product obtained by processing the workpiece. The protective film is configured of the protective film forming film 1, or preferably the cured protective film forming film 1.

The protective film forming sheet 3 according to the present embodiment is used for holding a workpiece at the time of performing division processing or the like on the workpiece and used for a work product obtained by the division processing to include a protective film.

(1) Dicing Sheet

The dicing sheet 4 of the protective film forming sheet 3 according to the present embodiment includes the base material 41 and the adhesive layer 42 laminated on one surface of the base material 41.

(1-1) Base Material

The constituent material of the base material 41 of the dicing sheet 4 is not particularly limited as long as the material is suitable for processing of a workpiece, for example, dicing or expanding the semiconductor wafer. The base material 41 of the dicing sheet 4 is formed of a film (hereinafter, referred to as a "resin film") non ally using a resin-based material as a main material.

Specific examples of the resin film include a polyethylene film such as a low-density polyethylene (LDPE) film, a linear low-density polyethylene (LLDPE) film, or a high-density polyethylene (HDPE) film; a polyolefin-based film such as a polypropylene film, a polybutene film, a polybutadiene film, a polymethyl pentene film, an ethylene-norbornene copolymer film, or a norbornene resin film; an ethylene-based copolymer film such as an ethylene-vinyl acetate copolymer film, an ethylene-(meth)acrylic acid copolymer film, or an ethylene-(meth)acrylic acid ester copolymer film; a vinyl polychloride-based film such as a vinyl polychloride film or a vinyl chloride copolymer film; a polyester-based film such as a polyethylene terephthalate film or a polybutylene terephthalate film; a polyurethane film; a polyimide film; a polystyrene film; a polycarbonate film; and a fluorine resin film. Moreover, cross-linked films of these or modified films such as ionomer films are also used. The above-described base material 41 may be a film formed of one kind of these, or a laminated film obtained by combining two or more kinds thereof. Further, "(meth)acrylic acid" in the present specification indicates both of acrylic acid and methacrylic acid. The same applies to other similar terminology.

Among these, from viewpoints of environmental safety and manufacturing costs, a polyolefin-based film is preferable and, among the examples of the polyolefin-based film, a polypropylene film having excellent heat resistance is preferable. When the polypropylene film is used, it is possible to provide heat resistance for the base material 41 without damaging expanding suitability of the dicing sheet 4 or pickup suitability of a chip. When the base material 41 has such heat resistance, it is possible to prevent the dicing sheet 4 from being loosened even in a case where the protective film forming film 1 is thermally cured in a state in which the protective film forming sheet 3 is adhered to a workpiece.

For the purpose of improving adhesiveness of the resin film to the adhesive layer 42 to be laminated on the surface of the resin film, one or both surfaces of the resin film can be subjected to a surface treatment according to an oxidation method or a roughening method or a primer treatment, if desired. Examples of the oxidation method include a corona discharge treatment, a plasma discharge treatment, a chromium oxidation treatment (wet), a flame treatment, a hot air treatment, ozone, and an ultraviolet irradiation treatment, and examples of the roughening method include a sand blasting method and a thermal spray treatment method.

The resin film of the base material 41 may contain various additives such as a colorant, a flame retardant, a plasticizer, an antistatic agent, a lubricant, and a filler.

The thickness of the base material 41 is not particularly limited as long as the base material can properly function in each process of using the protective film forming sheet 3. The thickness thereof is preferably in a range of 20 μm to 450 μm, more preferably in a range of 25 μm to 400 μm, and particularly preferably in a range of 50 μm to 350 μm.

The breaking elongation of the base material 41 of the dicing sheet 4 in the present embodiment is preferably 100% or greater and particularly preferably in a range of 200% to 1000% as a value measured under the conditions of a temperature of 23° C. and a relative humidity of 50%. Here, the breaking elongation is an elongation rate of a length of a test piece to an original length thereof at the time of test piece fracture during a tensile test carried out in conformity with JIS K7161:1994 (ISO 527-1 1993). The base material 41 having a breaking elongation of 100% or greater is unlikely to be broken during an expanding process and can easily separate a chip formed by cutting a workpiece.

Moreover, the tensile stress at the time of 25% strain of the base material 41 of the dicing sheet 4 in the present embodiment is preferably in a range of 5 N/10 mm to 15 N/10 mm and the maximum tensile stress thereof is preferably in a range of 15 MPa to 50 MPa. Here, the tensile stress at the time of 25% strain and the maximum tensile stress are measured by a test carried out in conformity with JIS K7161:1994. When the tensile stress at the time of 25% strain is 5 N/10 mm or greater and the maximum tensile stress is 15 MPa or greater, it is possible to prevent the base material 2 from being loosened and to prevent transport errors from being generated while a workpiece is adhered to the dicing sheet 4, and then the workpiece is fixed to a frame such as a ring frame. When the tensile stress at the time of 25% strain is 15 N/10 mm or less and the maximum tensile stress is 50 MPa or less, release of the dicing sheet 4 itself from a ring frame is suppressed at the time of expanding process. Further, the breaking elongation, the tensile stress at the time of 25% strain, and the maximum tensile stress indicate values measured in the longitudinal direction of original fabric in the base material 41.

(1-2) Adhesive Layer

The adhesive layer 42 included in the dicing sheet 4 of the protective film forming sheet 3 according to the present embodiment may be formed of a non-energy-ray-curable, pressure-sensitive adhesive or an energy-ray-curable, pressure-sensitive adhesive. As the non-energy-ray-curable, pressure-sensitive adhesive, a pressure-sensitive adhesive having desired adhesive strength and removability is preferable, and preferred examples thereof include an acrylic pressure-sensitive adhesive, a rubber pressure-sensitive adhesive, a silicone pressure-sensitive adhesive, a urethane pressure-sensitive adhesive, a polyester pressure-sensitive adhesive, and a polyvinyl ether pressure-sensitive adhesive. Among these, an acrylic pressure-sensitive adhesive which has high adhesiveness to the protective film forming film 1 and is capable of effectively suppressing separation of a workpiece or a work product during the dicing process or the like is preferable.

Since the adhesive strength of the energy-ray-curable, pressure-sensitive adhesive is decreased due to irradiation with energy rays, the dicing sheet 4 can be easily separated from a workpiece or a work product by performing irradiation with energy rays when the dicing sheet 4 is intended to be separated from a workpiece or a work product.

In a case where the adhesive layer 42 is formed of an energy-ray-curable, pressure-sensitive adhesive, it is preferable that the adhesive layer 42 in the protective film forming sheet 3 be cured. Since a material obtained by curing the energy-ray-curable, pressure-sensitive adhesive normally has a high elastic modulus and the surface thereof has high smoothness, when the protective film forming film 3 in contact with a cured portion formed of such a material is cured to form a protective film, the smoothness (gloss) of the surface in contact with the cured portion of the protective film becomes higher, and the appearance as a protective film of a chip becomes excellent. Moreover, when laser printing is performed on the protective film with high surface smoothness, the visibility of the printing is improved.

The energy-ray-curable, pressure-sensitive adhesive constituting the adhesive layer 42 may include a polymer having energy-ray curing properties as a main component, or may include a mixture of a monomer which does not have energy-ray curing properties, an energy-ray-curable polyfunctional monomer and/or an oligomer as a main component.

The case where the energy-ray-curable, pressure-sensitive adhesive includes a polymer having energy ray curing properties as a main component will be described below.

It is preferable that the polymer having energy ray curing properties be a (meth)acrylic acid ester (co)polymer (A) (hereinafter, also referred to as an "energy-ray-curable polymer (A)") to which a functional group (energy ray-curable group) having energy ray curing properties on the side chain thereof is introduced. It is preferable that the energy-ray-curable polymer (A) be obtained by reacting a (meth)acrylic copolymer (a1) having a functional group-containing monomer unit with an unsaturated group-containing compound (a2) having a substituent bonded to the functional group thereof.

The acrylic copolymer (a1) is formed of a constituent unit derived from a functional group-containing monomer and a constituent unit derived from a (meth)acrylic acid ester monomer or a derivative thereof.

It is preferable that the functional group-containing monomer as a constituent unit of the acrylic copolymer (a1) be a monomer including a functional group such as a polymerizable double bond, a hydroxyl group, an amino group, a substituted amino group, or an epoxy group in a molecule.

More specific examples of the functional group-containing monomer include 2-hydroxyethyl(meth)acrylate, 2-hydroxypropyl(meth)acrylate, 3-hydroxypropyl(meth)acrylate, and 4-hydroxybutyl(methy)acrylate, and these can be used alone or in combination of two or more kinds thereof.

As the (meth)acrylic acid ester monomer constituting the acrylic copolymer (a1), alkyl (meth)acrylate having 1 to 20 carbon atoms of an alkyl group, cycloalkyl (meth)acrylate, or benzyl (meth)acrylate is used. Among these, alkyl (meth) acrylate having 1 to 18 carbon atoms of an alkyl group such as methyl (meth)acrylate, ethyl (meth)acrylate, propyl (meth)acrylate, n-butyl (meth)acrylate, or 2-ethylhexyl (meth)acrylate is particularly preferably used.

The acrylic copolymer (a1) contains normally 3% by mass to 100% by mass of a constituent unit derived from the functional group-containing monomer and preferably in a range of 5% by mass to 40% by mass thereof. Further, the acrylic copolymer (a1) contains normally 0% by mass to 97% by mass of a constituent unit derived from a (meth) acrylic acid ester monomer or a derivative thereof and preferably in a range of 60% by mass to 95% by mass thereof.

The acrylic copolymer (a1) is obtained by copolymerizing the above-described functional group-containing monomer, the (meth)acrylic acid ester monomer, and the derivative thereof according to a conventional method, but dimethyl acrylamide, vinyl formate, vinyl acetate, and styrene may be copolymerized other than these monomers.

An energy-ray-curable polymer (A) is obtained by reacting the acrylic copolymer (a1) having the above-described functional group-containing monomer unit with the unsaturated group-containing compound (a2) having a substituent bonded to the functional group thereof.

The substituent included in the unsaturated group-containing compound (a2) can be appropriately selected according to the kind of the functional group of the functional group-containing monomer unit included in the acrylic copolymer (a1). For example, in a case where the functional group is a hydroxyl group, an amino group, or a substituted amino group, an isocyanate group or an epoxy group is preferable as a substituent. In a case where the functional group is an epoxy group, an amino group, a carboxyl group, or an aziridinyl group is preferable as a substituent.

In addition, the unsaturated group-containing compound (a2) includes 1 to 5 and preferably 1 to 2 energy-ray polymerizable carbon-carbon double bonds in a molecule. Specific examples of the unsaturated group-containing compound (a2) include 2-methacryloyloxyethyl isocyanate, meta-isopropenyl-α,α-dimethylbenzyl isocyanate, methacryloyl isocyanate, allyl isocyanate, 1,1-(bisacryloyloxymethyl)ethyl isocyanate; an acryloyl monoisocyanate compound obtained by reacting a diisocyanate compound or a polyisocyanate compound with a hydroxyethyl (meth)acrylate; an acryloyl monoisocyanate compound obtained by reacting a diisocyanate compound or a polyisocyanate compound, a polyol compound, and hydroxyethyl (meth)acrylate; glycidyl (meth)acrylate, (meth)acrylic acid, 2-(1-aziridinyl)ethyl (meth)acrylate, 2-vinyl-2-oxazoline, and 2-isopropenyl-2-oxazoline.

The unsaturated group-containing compound (a2) is used in a ratio of normally 10 equivalents to 100 equivalents and preferably 20 equivalents to 95 equivalents with respect to 100 equivalents of the functional group-containing monomer of the acrylic copolymer (a1).

In the reaction of the acrylic copolymer (a1) with the unsaturated group-containing compound (a2), the temperature, the pressure, the solvent, the time, the absence or presence of a catalyst, and the kind of the catalyst of the reaction can be appropriately selected according to the combination of a functional group and a substituent. In this manner, the functional group existing in the acrylic copolymer (a1) is reacted with the substituent in the unsaturated group-containing compound (a2) and the unsaturated group is introduced to the side chain of the acrylic copolymer (a1), thereby obtaining an energy-ray-curable polymer (A).

The weight-average molecular weight of the energy-ray-curable polymer (A) obtained in the above-described manner is preferably 10000 or greater, particularly preferably in a range of 150000 to 1500000, and more preferably in a range of 200000 to 1000000. Moreover, the weight-average molecular weight (Mw) in the present specification is a value measured by a gel permeation chromatography method (GPC method) in terms of polystyrene.

Even in a case where the energy-ray-curable, pressure-sensitive adhesive includes a polymer having energy-ray curing properties as a main component, the energy-ray-curable, pressure-sensitive adhesive may further contain an energy-ray-curable monomer and/or an oligomer (B).

As the energy-ray-curable monomer and/or the oligomer (B), for example, an ester or the like of polyhydric alcohol and (meth)acrylic acid can be used.

Examples of such an energy-ray-curable monomer and/or an oligomer (B) include monofunctional acrylic acid esters such as cyclohexyl (meth)acrylate and isobornyl (meth) acrylate; polyfunctional acrylic acid esters such as trimethylolpropane tri(meth)acrylate, pentaerythritol tri(meth)acrylate, pentaerythritol tetra(meth)acrylate, dipentaerythritol hexa(meth)acrylate, 1,4-butanediol di(meth)acrylate, 1,6-hexanediol di(meth)acrylate, polyethylene glycol di(meth) acrylate, and dimethylol tricyclodecane di(meth)acrylate; polyester oligo(meth)acrylate; and polyurethane oligo (meth)acrylate.

In a case where the energy-ray-curable monomer and/or the oligomer (B) are mixed with each other, the content of the energy-ray-curable monomer and/or the oligomer (B) in the energy-ray-curable, pressure-sensitive adhesive is preferably in a range of 5% by mass to 80% by mass and particularly preferably in a range of 20% by mass to 60% by mass.

Here, in a case where ultraviolet rays are used as energy rays in order to cure the energy-ray-curable resin composition, it is preferable to add a photopolymerization initiator (C). When the photopolymerization initiator (C) is used, the time for polymerization curing and the amount of light irradiation can be reduced.

Specific examples of the photopolymerization initiator (C) include benzophenone, acetophenone, benzoin, benzoin methyl ether, benzoin ethyl ether, benzoin isopropyl ether, benzoin isobutyl ether, benzoin benzoic acid, methyl benzoin benzoic acid, benzoin dimethyl ketal, 2,4-diethylthioxanthone, 1-hydroxycyclohexylphenylketone, benzyldiphenylsulfide, tetramethylthiuram monosulfide, azobisisobutyronitrile, benzyl, dibenzyl, diacetyl, β-chloroanthraquinone, (2,4,6-trimethylbenzyldiphenyl)phosphine oxide, 2-benzothiazole-N,N-diethyldithiocarbamate, oligo {2-hydroxy-2-methyl-1-[4-(1-propenyl)phenyl]propanone}, and 2,2-dimethoxy-1,2-diphenylethan-1-one. These may be used alone or in combination of two or more kinds thereof.

The content of the photopolymerization initiator (C) is preferably in a range of 0.1 parts by mass to 10 parts by mass and particularly preferably in a range of 0.5 parts by mass to 6 parts by mass with respect to 100 parts by mass of the energy-ray-curable copolymer (A) (100 parts by mass which is the total amount of the energy-ray-curable copolymer (A), and the energy ray-curable monomer and/or the oligomer (B) in a case where the energy-ray-curable monomer and/or the oligomer (B) are mixed with each other).

Other suitable components may be mixed with the energy-ray-curable, pressure-sensitive adhesive other than the above-described components. Examples of other components include polymer components or oligomer components (D) which do not have energy-ray curing properties, and crosslinking agents (E).

Examples of the polymer components or oligomer components (D) which do not have energy-ray curing properties include polyacrylic acid ester, polyester, polyurethane, polycarbonate, and polyolefin. Among these, a polymer or an oligomer having a weight-average molecular weight (Mw) of 3000 to 2500000 is preferable.

A polyfunctional compound having reactivity with a functional group included in the energy-ray curing copolymer (A) can be used as the crosslinking agent (E). Examples of the polyfunctional compound include an isocyanate compound, an epoxy compound, an amine compound, a melamine compound, an aziridine compound, a hydrazine compound, an aldehyde compound, an oxazoline compound, a metal alkoxide compound, a metal chelate compound, a metal salt, an aluminum salt, and a reactive phenolic resin.

When other components (D) and (E) are mixed with the energy-ray-curable, pressure-sensitive adhesive, tackiness and release properties before curing, strength after curing, adhesiveness to another layer, and storage stability can be improved. The mixed amount of these other components is not particularly limited, and is appropriately determined in a range of 0 parts by mass to 40 parts by mass with respect to 100 parts by mass of the energy-ray-curable copolymer (A).

Next, a case where the energy-ray-curable, pressure-sensitive adhesive includes a mixture of a polymer component which does not have energy-ray curing properties, an energy-ray-curable polyfunctional monomer and/or oligomer as a main component will be described below.

As the polymer component which does not have energy-ray cuing properties, for example, a component similar to the above-described acrylic copolymer (a1) can be used. The content of the polymer component which does not have energy-ray curing properties in an energy-ray-curable resin composition is preferably in a range of 20% by mass to 99.9% by mass and particularly preferably in a range of 30% by mass to 80% by mass.

A component similar to the above-described component (B) is selected as the energy-ray-curable polyfunctional monomer and/or the oligomer. In the blending ratio of the energy-ray-curable polyfunctional monomer and/or the oligomer to the polymer component which does not have energy-ray curing properties, the polyfunctional monomer and/or the oligomer is preferably in a range of 10 parts by mass to 150 parts by mass and particularly preferably in a range of 25 parts by mass to 100 parts by mass with respect to 100 parts by mass of the polymer component which does not have energy-ray curing properties.

Even in this case, the photopolymerization initiator (C) or the crosslinking agent (E) can be appropriately mixed in the same manner described above.

The thickness of the adhesive layer 42 is not particularly limited as long as the adhesive layer 42 can properly function in each process of using the protective film forming sheet 3. Specifically, the thickness thereof is preferably in a range of 1 µm to 50 µm, particularly preferably in a range of 2 µm to 30 µm, and more preferably in a range of 3 µm to 20 µm.

As the pressure-sensitive adhesive constituting the adhesive layer 5 for a jig, a pressure-sensitive adhesive having desired adhesive strength and removability is preferable and preferred examples thereof include an acrylic pressure-sensitive adhesive, a rubber pressure-sensitive adhesive, a silicone pressure-sensitive adhesive, a urethane pressure-sensitive adhesive, a polyester pressure-sensitive adhesive, and a polyvinyl ether pressure-sensitive adhesive. Among these, an acrylic pressure-sensitive adhesive which has high adhesiveness to a jig of a ring frame or the like, and is capable of effectively suppressing separation of the protective film forming sheet 3 from the ring frame or the like during the dicing process or the like is preferable. In addition, a base material may be present as a core material in the middle of the adhesive layer 5 for a jig in the thickness direction.

The thickness of the adhesive layer 5 for a jig is preferably in a range of 5 µm to 200 µm, and particularly preferably in a range of 10 µm to 100 µm from the viewpoint of adhesiveness to the jig of the ring frame or the like.

(2) Method of Producing Protective Film Forming Sheet

Preferably, the protective film forming sheet 3 can be produced by separately preparing a first laminate including the protective film forming film 1 and a second laminate including the dicing sheet 4 and then laminating the protective film forming film 1 with the dicing sheet 4 using the first laminate and the second laminate, but the production method is not limited thereto.

The protective film forming film 1 is formed on the release surface of a first release sheet in order to produce the first laminate. Specifically, the protective film forming film 1 is formed by preparing a curable adhesive constituting the protective film forming film 1 and a coating agent for a protective film forming film, which further contains a solvent if desired, coating the release surface of the first release sheet with the curable adhesive and the coating agent using a coating machine such as a roll coater, a knife coater, a roll knife coater, an air knife coater, a die coater, a bar coater, a gravure coater, or a curtain coater and then drying the release surface. Next, the release surface of the second release sheet is laminated with the exposed surface of the protective film forming film 1 to be pressure-bonded to each other, and a laminate (first laminate) formed by interposing the protective film forming film 1 between two release sheets is obtained.

In the first laminate, the protective film forming film 1 (and the second release sheet) may be half-cut, if desired, so as to have a desired shape, for example, a circular shape or the like. In this case, extra portions of the protective film forming film 1 and the second release sheet which are generated due to the half-cut may be appropriately removed.

Moreover, in order to produce the second laminate, the adhesive layer 42 is formed by coating the release surface of a third release sheet with a coating agent for an adhesive layer which contains a pressure-sensitive adhesive constituting the adhesive layer 42, and further contains a solvent if desired, and drying the release surface. Thereafter, the base material 41 is pressure-bonded to the exposed surface of the adhesive layer 42 and then a laminate (second laminate) which includes the dicing sheet 4 formed of the base material 41 and the adhesive layer 42; and the third release sheet is obtained.

Here, in a case where the adhesive layer 42 is formed of the energy-ray-curable, pressure-sensitive adhesive, the adhesive layer 42 is irradiated with energy rays at this stage and the adhesive layer 42 may be cured or the adhesive layer 42 may be cured after being laminated with the protective film forming film 1. In addition, in a case where the adhesive layer 42 is cured after being laminated with the protective film forming film 1, the adhesive layer 42 may be cured before the dicing process or the adhesive layer 42 may be cured after the dicing process.

As the energy rays, ultraviolet rays or electron beams are normally used. The irradiation amount of the energy rays varies depending on the kind of the energy ray. For example, in a case of ultraviolet rays, the irradiation amount thereof is preferably in a range of 50 mJ/cm$^2$ to 1000 mJ/cm$^2$ and particularly preferably in a range of 100 mJ/cm$^2$ to 500 mJ/cm$^2$ in terms of the light intensity. Further, in a case of electron beams, the irradiation amount thereof is preferably in a range of approximately 10 krad to 1000 krad.

When the first laminate and the second laminate are obtained in the above-described manner, the second release sheet is release from the first laminate and the third release sheet is release from the second laminate, and the protective film forming film 1 exposed in the first laminate overlaps the adhesive layer 42 of the dicing sheet 4 exposed in the second laminate to be pressure-bonded to each other. The dicing sheet 4 is half-cut, if desired, so as to have a desired shape, for example, a circular shape having a diameter larger than that of the protective film forming film 1. In this case, an extra portion of the dicing sheet 4 which is generated due to the half-cut may be appropriately removed.

In this manner, the protective film forming sheet 3 which includes the dicing sheet 4 obtained by laminating the adhesive layer 42 on the base material 41, the protective film forming film 1 laminated on the adhesive layer 42 side of the dicing sheet 4, and the first release sheet laminated on the opposite side of the dicing sheet 4 in the protective film forming film 1 is obtained. Finally, after the first release sheet is released therefrom, the adhesive layer 5 for a jig is formed in the peripheral edge of the surface on the opposite side of the dicing sheet 4 in the protective film forming film 1.

A method of forming the adhesive layer 5 for a jig is not limited. One example is as follows. First, an adhesive composition for forming the adhesive layer 5 for a jig and a coating composition further containing a solvent as needed are prepared. An adhesive layer for a jig is formed on a release sheet by coating the release surface of the release sheet which is separately prepared and drying the obtained coating film. A three-layer laminate including a release sheet, an adhesive layer for a jig, and a release sheet by adhering the release surface of another release sheet to the exposed surface of the adhesive layer for a jig on the release sheet. Next, a two-layer laminate which has an annular shape in which the outer periphery and the inner periphery are concentric in a plan view and is formed of the release sheet and the adhesive layer for a jig is formed on another release sheet in the above-described three-layer laminate by performing half-cutting such that the one release sheet and the adhesive layer for a jig of the three-layer laminate is cut and releasing and removing the residual portion. The release sheet, on which the cutting processing is performed, of the laminate formed of the two-layer laminate and a release sheet is released therefrom, and the surface of the adhesive layer for a jig is exposed. When the exposed surface is adhered to the peripheral edge of the surface on the opposite side of the dicing sheet 4 in the protective film forming film 1, the adhesive layer for a jig is used as the adhesive layer 5 for a jig laminated on the protective film forming film 1.

Finally, the protective film forming sheet 3 having the configuration of FIG. 2 can be obtained by releasing the release sheet on the adhesive layer 5 for a jig. Further, the adhesive layer 5 for a jig may be configured of only the adhesive layer as exemplified above or may be configured of pressure-sensitive adhesive double coated tape formed by laminating adhesive layers on both surfaces of a core material.

(3) Method of Using Protective Film Forming Sheet 3

As an example of a method of using the protective film forming sheet 3 according to the present embodiment, a method of manufacturing a chip, on which a protective film is laminated as a work product, from a semiconductor wafer serving as a workpiece will be described below.

Figure 4:
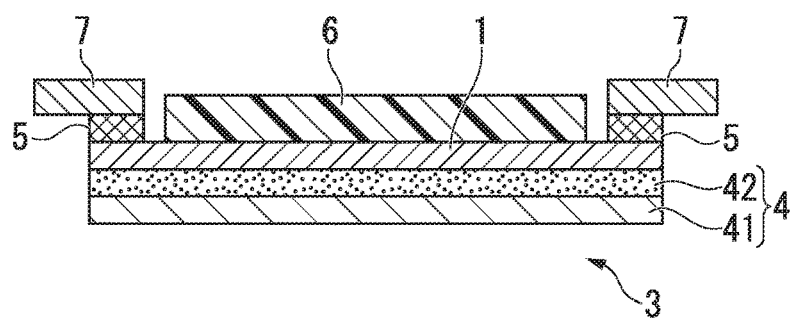
FIG. 4 is a sectional view illustrating an example of use of the protective film forming sheet, specifically, a first laminated structure according to an embodiment of the present invention.

As illustrated in FIG. 4, the protective film forming film 1 of the protective film forming sheet 3 is adhered to a semiconductor wafer 6 and the adhesive layer 5 for a jig is adhered to a ring frame 7. When the protective film forming film 1 is adhered to the semiconductor wafer 6, the protective film forming film 1 is heated, if desired, and tackiness may be exhibited.

Next, a protective film is formed by curing the protective film forming film 1, thereby obtaining a laminated structure (in the present specification, such a laminated structure is also referred to as a "first laminated structure") having a configuration in which the semiconductor wafer 6 formed by laminating a protective film on the surface of the adhesive layer 42 side of the dicing sheet 4 functioning as an expandable dicing sheet is laminated thereon. The first laminated structure illustrated in FIG. 4 further includes the adhesive layer 5 for a jig and the ring frame 7. In a case where the protective film forming film 1 is a thermosetting adhesive, the protective film forming film 1 may be heated at a predetermined temperature for an appropriate amount of time. In addition, the protective film forming film 1 may be cured after a modified layer is formed using laser.

When the first laminated structure including the semiconductor wafer 6 on which a protective film is laminated is obtained in the above-described manner, the protective film is irradiated with laser beams through the dicing sheet 4, if desired, and then laser printing is performed. Further, the laser printing may be performed before the protective film forming film 1 is cured.

Subsequently, the first laminated structure is disposed in a laser irradiation device for division processing, the position of the surface of the semiconductor wafer 6 covered with the protective film 1 is detected, and a modified layer is formed in the semiconductor wafer 6 using laser for processing. Here, the protective film forming sheet 3 according to the present embodiment satisfies the conditions of the light transmittance described above, a modified layer can be easily formed even when laser beams applied from the laser for processing are applied to the semiconductor wafer 6 through a laminate formed of a protective film and a dicing sheet.

Next, a force (tensile strength in the in-plane direction of the main surface) is applied to the semiconductor wafer 6, on which a protective film is laminated, by performing an expanding process of expanding the dicing sheet 4 functioning as a dicing sheet. As a result, the semiconductor wafer 6 on which the protective film adhered to the dicing sheet 4 is laminated is divided and a chip on which the protective film is laminated is obtained. Thereafter, the chip on which the protective film is laminated is picked up from the dicing sheet 4 using a pick-up device.

4. Still Another Protective Film Forming Sheet 3A

Figure 3:
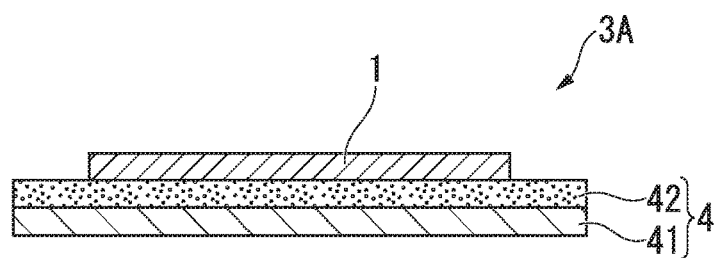
FIG. 3 is a sectional view illustrating a protective film forming sheet according to still another embodiment of the present invention.

FIG. 3 is a sectional view illustrating a protective film forming sheet according to still another embodiment of the present invention. As illustrated in FIG. 3, a protective film forming sheet 3A according to the present embodiment includes the dicing sheet 4 formed by laminating the adhesive layer 42 on one surface of the base material 41 and the protective film forming film 1 which is laminated on the adhesive layer 42 side of the dicing sheet 4. The protective film forming film 1 in the embodiment is formed to be almost similar to a workpiece in the plane direction or slightly larger than the workpiece, and is also formed to be smaller than the dicing sheet 4 in the plane direction. The adhesive layer 42, in a portion which does not have the protective film forming film 1 laminated thereon, can be adhered to a jig such as a ring frame or the like.

The materials and the thickness of respective members of the protective film forming sheet 3A according to the present embodiment are the same as those of respective members of the above-described protective film forming sheet 3. However, in a case where the adhesive layer 42 is formed of an energy-ray-curable, pressure-sensitive adhesive, it is preferable that a portion in contact with the protective film forming film 1 in the adhesive layer 42 allow the energy-ray-curable, pressure-sensitive adhesive to be cured and other portions do not allow the energy-ray-curable, pressure-sensitive adhesive to be cured. In this manner, the smoothness (gloss) of the protective film formed by curing the protective film forming film 1 can be increased and the adhesive strength to a jig of a ring frame or the like can be maintained to be high.

Moreover, an adhesive layer for a jig similar to the adhesive layer 5 for a jig of the above-described protective film forming sheet 3 may be separately provided in the peripheral edge on the opposite side of the base material 41 in the adhesive layer 42 of the dicing sheet 4 of the protective film forming sheet 3A.

5. Method of Manufacturing Work Product

Hereinafter, the method of manufacturing a work product from a workpiece and each target of a modified film-forming process which is a process of forming a modified layer in a workpiece will be collectively described using the protective film forming film 1 or the protective film forming sheets 3 and 3A according to the present embodiment.

(1) In a Case where the Target of the Modified Layer Forming Process is a Workpiece (First Case)

In a case where the target of the modified layer forming process is a single workpiece, first, a first modified layer forming process of forming a modified layer in the inside of workpiece is performed by irradiating the workpiece with laser beams in the infrared region such that the laser beams are focused on a focal point set in the inside of the workpiece such as a semiconductor wafer. Next, a first protective film forming film laminating process of laminating the protective film forming film 1 on one surface (in a case of a semiconductor wafer, a surface on the opposite side of the surface on which a circuit is formed, that is, a rear surface) of the workpiece on which the modified layer is formed is performed.

Hereinafter, a work product is obtained by subsequently performing a dividing process and a protective film forming process.

In the dividing process, a divided product is obtained by applying a force to the workpiece on which the modified layer is formed so that the workpiece is divided. Until the dividing process is started, a state in which the dicing sheet 4 is laminated on a surface on the opposite side of the surface facing the workpiece in the protective film forming film 1 laminated on the workpiece or a protective film formed from the protective film forming film 1 is realized.

In protective film forming process, a protective film is formed from the protective film forming film 1. The implementation order of the dividing process and the protective film forming process is not limited. Either process can be performed first. In a case where the protective film forming film 1 contains thermosetting materials as described above, since the protective film forming process includes a process of heating, for example, heating and maintaining at 130° C. for 2 hours, the dicing sheet 4 needs to be a material that withstands the heating during the protective film forming process in a case where the protective film forming process is performed after the dividing process.

By carrying out such a process, a work product (in a case where the workpiece is a semiconductor wafer, the semiconductor chip on which a protective film is laminated becomes the work product) formed by laminating a protective film on one surface (in a case where the workpiece is a semiconductor wafer, the surface becomes a rear surface) of a divided product (in a case where the workpiece is a semiconductor wafer, the divided product becomes the semiconductor chip) of a workpiece is obtained as a resultant of the dividing process.

In the first case, since a modified layer is formed in the workpiece, the protective film forming film 1 may satisfy the conditions of the above-described breaking index in a case where the dividing process is performed before the protective film forming process, and a protective film formed from the protective film forming film 1 according to the present embodiment may satisfy the conditions of the above-described breaking index in a case where the division processing is performed before the protective film forming process. The division processability is not affected by whether the protective film or the like according to the present embodiment satisfies the conditions of the above-described light transmittance.

In the first case, the state of lamination of the protective film or the like and the dicing sheet 4 on the workpiece on which a modified layer is formed is not limited. That is, the protective film forming film 1 may be laminated on the workpiece on which a modified layer is formed and then the dicing sheet 4 may be laminated on the protective film forming film 1, or a protective film is formed from the protective film forming film 1 laminated on the workpiece and then the dicing sheet 4 may be laminated on the protective film. Alternatively, the protective film forming sheets 3 and 3A may be laminated on the workpiece on which a modified layer is formed. In the case where the protective film forming sheets 3 and 3A are laminated on the workpiece, the protective film forming film 1 laminated on the workpiece is in a state in which the dicing sheet 4 is laminated on one surface thereof (2) In a Case where the Target of the Modified Layer Forming Process is a Laminated Structure of a Workpiece and Protective Film Forming Film 1 (Second Case)

In a case where the target of the modified layer forming process is a laminated structure of a workpiece and the protective film forming film 1, first, a second protective film forming film laminating process of laminating the protective film forming film 1 on one surface of the workpiece is performed.

Next, a second modified layer forming process of forming a modified layer in the inside of workpiece is performed by irradiating the workpiece through the protective film forming film 1 with laser beams in the infrared region such that the laser beams are focused on a focal point set in the inside of the workpiece on which the protective film forming film 1 is laminated. Since the workpiece is irradiated with laser beams through the protective film forming film 1, it is preferable that the protective film forming film 1 satisfy the conditions of the above-described light transmittance, in the second case.

Hereinafter, a work product is obtained by performing the above-described dividing process and the protective film forming process. The implementation order of the dividing process and the protective film forming process is optional. In a case where the division processing is performed before the protective film forming process, the protective film forming film 1 may satisfy the conditions of the above-described breaking index. In a case where the division processing is performed after the protective film forming process, the protective film may satisfy the conditions of the above-described breaking index.

Further, the state of lamination of the protective film or the like and the dicing sheet 4 on the workpiece is not limited. However, since the workpiece is irradiated with laser beams through the protective film forming film 1 in the second case, the protective film forming sheets 3 and 3A are not laminated on the workpiece. In other words, a process of laminating a dicing sheet on the protective film or the like in a state of being laminated on the workpiece on which a modified layer is formed is performed after the second modified layer forming process.

(3) In a Case where the Target of the Modified Layer Forming Process is a Laminated Structure of a Workpiece, Protective Film Forming Film 1, and Dicing Sheet 4 (Third Case)

In a case where the target of the modified layer forming process is a laminated structure of a workpiece, the protective film forming film 1, and the dicing sheet 4, first, a laminated structure including a workpiece, the protective film forming film 1 laminated on one surface of the workpiece, and the dicing sheet 4 laminated on a surface which is the side opposite to a side facing the workpiece of the protective film forming film 1 is prepared. As an example, this laminated structure can be obtained by laminating the protective film forming sheets 3 and 3A on the workpiece.

A third modified layer forming process of forming a modified layer in the inside of workpiece is performed by irradiating the workpiece having the laminated structure with laser beams in the infrared region from the dicing sheet 4 side such that the laser beams are focused on a focal point set in the inside of the workpiece. Since the workpiece is irradiated with laser beams through the dicing sheet 4 and the protective film forming film 1, it is preferable that the protective film forming film 1 satisfy the conditions of the above-described light transmittance, in the third case. In the third case, at the time of using the protective film forming sheets 3 and 3A, it is preferable that the protective film forming sheets 3 and 3A also satisfy the conditions of the above-described light transmittance.

Hereinafter, a work product is obtained by performing the above-described dividing process and protective film forming process. The implementation order of the dividing process and the protective film forming process is optional. In addition, the state of lamination of the protective film forming film 1 and the dicing sheet 4 on the workpiece is not limited. The laminate of the protective film forming film 1 and the dicing sheet 4 may be appropriately laminated on the workpiece at the stage where the third modified layer forming process is started. Specifically, first, the protective film forming film 1 may be laminated on the workpiece and then the dicing sheet 4 may be laminated thereon, or the protective film forming sheets 3 and 3A may be laminated on the workpiece.

(4) In a Case where the Target of the Modified Layer Forming Process is a Laminated Structure of a Workpiece and Protective Film (Fourth Case)

In a case where the target of the modified layer forming process is a laminated structure of a workpiece and a protective film, the second protective film forming film laminating process of laminating the protective film forming film 1 on one surface of the workpiece is performed. Subsequently, the protective film forming process of forming a protective film from the protective film forming film 1 is performed. Next, the fourth modified layer forming process of forming a modified layer in the inside of workpiece is performed by irradiating the workpiece through the protective film with laser beams in the infrared region such that the laser beams are focused on a focal point set in the inside of the workpiece on which the protective film is laminated. Accordingly, it is preferable that the protective film satisfy the conditions of the above-described light transmittance in the fourth case. For this, the protective film forming film 1 may satisfy the conditions of the above-described light transmittance.

Moreover, after the dividing process of dividing a workpiece on which a modified layer is formed by applying a force to the workpiece to obtain a divided product, a work product formed by laminating a protective film on one surface of the divided product is obtained as a resultant of the dividing process. Therefore, the protective film may satisfy the conditions of the above-described breaking index in the fourth case.

(5) In a Case where the Target of the Modified Layer Forming Process is a Laminated Structure of a Workpiece, Protective Film, and Dicing Sheet 4 (Fifth Case)

In a case where the target of the modified layer forming process is a laminated structure of a workpiece, a protective film, and the dicing sheet 4, first, a process of preparing the laminated structure is performed. Examples of the method of preparing the laminated structure include sequential lamination and batch lamination.

That is, in the sequential lamination, the second protective film forming film laminating process of laminating the protective film forming film 1 on one surface of a workpiece, the protective film forming process of forming a protective film from the protective film forming film 1, and a second dicing sheet laminating process of laminating the dicing sheet 4 on the protective film laminated on the workpiece are performed.

In addition, in the batch lamination, a third protective film forming film laminating process of laminating the protective film forming film 1, on which the dicing sheet 4 is laminated, on one surface of a workpiece is performed. Typically, the protective film forming sheets 3 and 3A may be laminated on the workpiece. Next, the protective film forming process of forming a protective film from the protective film forming film 1 is performed.

The above-described fifth modified layer forming process of forming a modified layer in the inside of workpiece is performed by irradiating the workpiece through the protective film and the dicing sheet 4 with laser beams in the infrared region such that the laser beams are focused on a focal point set in the inside of the workpiece of the laminated structure obtained in the above-described manner. Since the workpiece is irradiated with laser beams through the dicing sheet 4 and the protective film, it is preferable that the protective film forming film 1 satisfy the conditions of the above-described light transmittance, in the fifth case. In the fifth case, at the time of using the protective film forming sheets 3 and 3A, it is preferable that the protective film forming sheets 3 and 3A also satisfy the conditions of the above-described light transmittance.

Moreover, after the dividing process of dividing the workpiece on which a modified layer is formed by applying a force to the workpiece to obtain a divided product, a work product formed by laminating a protective film on one surface of the divided product is obtained as a resultant of the dividing process. Therefore, the protective film may satisfy the conditions of the above-described breaking index in the fifth case.

The embodiments described above are described not to limit the present invention but to facilitate the understanding of the present invention. Accordingly, respective elements disclosed in the above-described embodiment are intended to include all design modifications or equivalents belonging to the technical scope of the present invention.

For example, a release sheet may be laminated on the opposite side of the dicing sheet 4 in the protective film forming film 1 of the protective film forming sheets 3 and 3A.

EXAMPLES

Hereinafter, the present invention will be described in detail with reference to examples, but the scope of the present invention is not limited to these examples.

Examples 1 to 9 and Comparative Examples 1 and 2

The following respective components were mixed with each other at a blending ratios (parts by mass in terms of the solid content) listed in Table 1 and diluted with methyl ethyl ketone such that the solid content concentration became 61% by mass, thereby preparing a coating agent for a protective film forming film.

(A-1) polymer component: acrylic polymer (weight-average molecular weight: 800000, glass transition temperature: −1° C.) obtained by copolymerizing 10 parts by mass of n-butyl acrylate, 70 parts by mass of methyl acrylate, 5 parts by mass of glycidyl methacrylate, and 15 parts by mass of 2-hydroxyethyl acrylate (A-2) polymer component: acrylic polymer (weight-average molecular weight: 800000, glass transition temperature: −28° C.) obtained by copolymerizing 55 parts by mass of n-butyl acrylate, 10 parts by mass of methyl acrylate, 20 parts by mass of glycidyl methacrylate, and 15 parts by mass of 2-hydroxyethyl acrylate (A-3) polymer component: acrylic polymer (weight-average molecular weight: 800000, glass transition temperature: 6° C.) obtained by copolymerizing 85 parts by mass of methyl acrylate and 15 parts by mass of 2-hydroxyethyl acrylate (B-1) Bisphenol A type epoxy resin ("jER828," manufactured by Mitsubishi Chemical Corporation, epoxy equivalent: 184 g/eq to 194 g/eq)

(B-2) Dicyclopentadiene type epoxy resin ("EPICLON HP-7200E1H," manufactured by DIC Corporation, epoxy equivalent: 255 g/eq to 260 g/eq)

(B-3) Bisphenol A type epoxy resin ("jER1055," manufactured by Mitsubishi Chemical Corporation, epoxy equivalent: 800 g/eq to 900 g/eq)

(B-4) Solid epoxy resin: phenol novolac type epoxy resin ("EPPN502H," manufactured by Nippon Kayaku Co., Ltd., epoxy equivalent: 167 g/eq)

(B-5) Acryloyl group-added cresol novolac type epoxy resin ("CAN-147," manufactured by Nippon Kayaku Co., Ltd., epoxy equivalent: 518 g/eq, number average molecular weight: 2100, content of unsaturated group: equivalent to content of epoxy group)

(C-1) Thermally-active latent epoxy resin-curing agent: dicyan diamide ("Adeka Hardener EH-3636AS," manufactured by ADEKA Corporation, active hydrogen amount: 21 g/eq)

(C-2) Curing accelerator: 2-phenyl-4,5-dihydroxymethyl-imidazole ("Curezol 2PHZ," manufactured by SHIKOKU CHEMICALS CORPORATION)

(C-3) Hardener: aralkyl type phenol resin ("MILEX XLC-4L," manufactured by Mitsui Chemicals, Inc.)

(D) Silica filler ("SC2050MA," manufactured by ADMATECHS CO., LTD., average particle diameter: 0.5 μm)

(E) Colorant: carbon black ("#MA650," manufactured by Mitsubishi Chemical Corporation, average particle diameter: 28 nm)

(F) Isocyanate compound ("BHS-8515," manufactured by TOYO INK CO., LTD.)

(G) Silane coupling agent ("KBM403," manufactured by Shin-Etsu Chemical Co., Ltd.)

(H) Thermoplastic resin ("BYRON220," manufactured by TOYOBO CO., LTD.)

TABLE 1

|     | Example 1 | Example 2 | Example 3 | Example 4 | Example 5 | Example 6 | Example 7 | Example 8 | Example 9 | Comparative Example 1 | Comparative Example 2 |
|-----|-----------|-----------|-----------|-----------|-----------|-----------|-----------|-----------|-----------|-----------------------|-----------------------|
| A-1 | 26        | 26        | 26        |           |           |           |           |           | 26.02     | 12.3                  | 12.3                  |
| A-2 |           |           |           | 2.37      | 1.31      |           | 3.47      | 3.3       |           |                       |                       |
| A-3 |           |           |           |           |           | 12.2      |           |           |           |                       |                       |
| B-1 | 10.4      | 10.4      | 10.4      | 3.16      | 3.19      |           | 5.2       | 0.64      | 10.4      |                       |                       |
| B-2 | 5.2       | 5.2       | 5.2       | 9.37      |           |           |           | 0.97      | 5.2       |                       |                       |
| B-3 | 1.7       | 1.7       | 1.7       |           |           |           | 6.94      | 0.33      | 1.73      |                       |                       |
| B-4 |           |           |           |           | 3.54      |           | 1.73      |           |           |                       |                       |
| B-5 |           |           |           |           |           | 3.93      |           | 1.3       |           | 3.95                  | 3.95                  |
| C-1 | 0.42      | 0.42      | 0.42      | 0.27      |           |           | 0.18      | 0.08      | 0.42      |                       |                       |
| C-2 | 0.42      | 0.42      | 0.42      | 0.27      | 0.05      |           | 0.18      | 0.08      | 0.42      |                       |                       |
| C-3 |           |           |           |           | 3.21      | 0.64      |           |           |           | 0.64                  | 0.64                  |
| D   | 55.5      | 55.5      | 55.5      |           | 2.02      |           |           | 10.4      | 55.5      |                       |                       |
| E   | 0.2       | 0.03      |           | 0.17      | 0.35      | 0.1       | 0.07      | 0.03      | 0.69      | 0.69                  |                       |
| F   |           |           |           | 0.08      |           | 0.08      | 0.09      |           |           | 0.08                  | 0.08                  |
| G   | 0.09      | 0.09      | 0.09      | 0.09      | 0.09      | 0.09      | 0.09      | 0.09      | 0.09      | 0.09                  | 0.09                  |
| H   |           |           |           |           | 3.03      |           |           |           |           |                       |                       |

A first release sheet R (SP-PET 382150, manufactured by LINTEC Corporation, thickness: 38 μm) obtained by forming a silicone-based release agent layer on one surface of a polyethylene terephthalate (PET) film and a second release sheet R' (SP-PET 381031, manufactured by LINTEC Corporation, thickness: 38 μm) obtained by forming a silicone-based release agent layer on one surface of a PET film were prepared.

The release surface of the first release sheet R was coated with the above-described coating agent for a protective film forming film such that the thickness of a protective film forming film $P_0$ to be finally obtained was 25 μm, the release surface thereof was dried in an oven at a temperature of 120° C. for 2 minutes, and the protective film forming film $P_0$ was formed. Next, the release surface of the second release sheet R' was bonded to the surface of the obtained protective film forming film $P_0$, and then a protective film forming sheet $RP_0R'$ formed of the first release sheet R (the release sheet 21 in FIG. 1), the protective film forming film $P_0$ (the protective film forming film 1 in FIG. 1) (thickness: 25 μm), and the second release sheet R' was obtained.

The protective film forming sheet $RP_0R'$ was separately prepared in the above-described manner, the second release sheet R' was released therefrom, and the exposed surface of the protective film forming film $P_0$ was bonded to the surface of an adhesive layer of a dicing sheet D ("Adwill D-821HS," manufactured by Lintec Corporation), thereby obtaining a laminate [$P_0D$] formed of the protective film forming film $P_0$ and the dicing sheet D in a state in which the first release sheet R was adhered to the surface of the protective film forming film $P_0$ side.

Test Example 1

<Measurement of Breaking Stress and Breaking Strain>

A tensile test was performed on the protective film forming film $P_0$ and a protective film $P_1$ formed from the protective film forming film $P_0$ using a dynamic mechanical analysis device ("DMA Q800," manufactured by TA Instruments. Japan). In two sheets of the protective film forming sheets $RP_0R'$ obtained in the examples and the comparative examples, the second release sheets R' were released and protective film forming sheets $RP_0$ were adhered to each other such that the surfaces of the exposed protective film forming films $P_0$ faced to each other, and then the respective first release sheets R were released therefrom, thereby obtaining a protective film forming film $P_0$ having a thickness of 50 μm. In addition, the protective film forming film $P_0$ was cut into a size of a width of 5 mm and a length of 5 mm, and then a test piece formed of the protective film forming film $P_0$ was obtained. A test piece formed of the protective film $P_1$ was prepared by separately preparing the test piece formed of the protective film forming film $P_0$ having a thickness of 50 μm and then heating the test piece at 130° C. for 2 hours.

Respective test pieces were held at 0° C. for 1 minute and a tensile test was performed thereon at a speed of 10 N/min. The breaking stress (unit: MPa) and the breaking strain (unit: %) were extracted from the results. The measurement results and the calculation results of the breaking index (unit: MPa·%) are listed in Table 2.

Test Example 2

<Evaluation of Division Processability of Protective Film Forming Film>

A silicon wafer S having a thickness of 100 μm and an outer diameter of 8 inches as serving as a workpiece was irradiated with laser, which was focused on the inside of the silicon wafer S, while scanning along a scheduled cutting line set so as to form a chip body having a dimension of 9 mm×9 mm using a laser irradiation device ("DFL 7360," manufactured by DISCO Corporation, wavelength of laser: 1064 nm), thereby forming a modified layer in the inside of the silicon wafer S.

The protective film forming film $P_0$ which was cut-processed in the same shape as the shape of the silicon wafer S was adhered to the silicon wafer S on a table heated at 70° C. using a sticking device ("RAD-3600 F/12," manufactured by Lintec Corporation), and then a laminate $SP_0$ of the silicon wafer S having a modified layer formed therein by irradiation with laser and the protective film forming film $P_0$ was obtained.

A dicing sheet D ("Adwill D-821HS," manufactured by Lintec Corporation) was adhered to the protective film forming film $P_0$ side of the laminate $SP_0$ using a sticking device ("RAD-2700 F/12," manufactured by Lintec Corporation), and then a laminate $SP_0D$ of the silicon wafer S having a modified layer formed therein, the protective film forming film $P_0$, and the dicing sheet D was obtained in a state of being fixed to a ring frame.

The laminate $SP_0D$ including the silicon wafer S having a modified layer formed therein was expanded in a state in which the temperature of the laminate $SP_0D$ was maintained at 0° C. under the conditions of a drawdown speed of 100 mm/sec and an expansion amount of 10 mm using an expanding device ("DDS2300," manufactured by DISCO Corporation). As a result, at least a part of the silicon wafer S having a modified layer formed therein was divided along a scheduled dividing line, thereby obtaining a plurality of chips.

The division properties of the protective film forming film $P_0$ was evaluated based on the following criteria using a first division ratio (unit: %) that is a ratio of the length of the cutting line of the protective film forming film $P_0$, generated along the cutting line of the silicon wafer S, to the length of the cutting line of the silicon wafer S, actually generated along the scheduled cutting line by performing the above-described process.

The first division ratio was 100%: the division properties were excellent ("A" in Table 1)

The first division ratio was 80% or greater and less than 100%: the division properties were acceptable ("C" in Table 1)

The first division ratio was less than 80%: the division properties were not acceptable ("D" in Table 1)

The evaluation results are listed in Table 2.

Test Example 3

<Evaluation of Division Processability of Protective Film>

A silicon wafer S having a thickness of 100 μm and an outer diameter of 8 inches was irradiated with laser, which was focused on the inside of the silicon wafer S, while scanning along a scheduled cutting line set so as to form a chip body having a dimension of 9 mm×9 mm using a laser irradiation device ("DFL 7360," manufactured by DISCO Corporation, wavelength of laser: 1064 nm), thereby forming a modified layer in the inside of the silicon wafer S.

The protective film forming film $P_0$ was cut-processed in the same shape as the shape of the silicon wafer S and the cut-processed protective film forming film $P_0$ was adhered to the silicon wafer S having a modified layer formed therein on a table heated at 70° C., using a sticking device ("RAD-3600 F/12," manufactured by Lintec Corporation), and then a laminate $SP_0$ of the silicon wafer S having a modified layer formed therein and the protective film forming film $P_0$ was obtained. The laminate $SP_0$ was heated at 130° C. for 2 hours in an air atmosphere, and a protective film $P_1$ was formed from the protective film forming film $P_0$ included in the laminate $SP_0$, thereby obtaining a laminate $SP_1$ formed of the silicon wafer S having a modified layer formed therein and the protective film $P_1$.

A dicing sheet D ("Adwill D-821HS," manufactured by Lintec Corporation) was adhered to the protective film $P_1$ side of the laminate $SP_1$ using a sticking device ("RAD-2700 F/12," manufactured by Lintec Corporation), and then a laminate $SP_1D$ of the silicon wafer S having a modified layer formed therein, the protective film $P_1$, and the dicing sheet D was obtained in a state of being fixed to a ring frame.

The laminate $SP_1D$ including the silicon wafer S having a modified layer formed therein was expanded in a state in which the temperature of the laminate $SP_1D$ was maintained at 0° C. under the conditions of a drawdown speed of 100 mm/sec and an expansion amount of 10 mm using an expanding device ("DDS2300," manufactured by DISCO Corporation). As a result, at least a part of the silicon wafer S was divided along a scheduled dividing line, thereby obtaining a plurality of chips.

The division properties of the protective film $P_1$ were evaluated based on the following criteria using a second division ratio (unit: %) that is a ratio of the length of the cutting line of the protective film $P_1$, generated along the cutting line of the silicon wafer S, to the length of the cutting line of the silicon wafer S, actually generated along the scheduled cutting line by performing the above-described process.

The second division ratio was 100%: the division properties were excellent ("A" in Table 1)

The second division ratio was 80% or greater and less than 100%: the division properties were acceptable ("C" in Table 1) The second division ratio was less than 80%: the division properties were not acceptable ("D" in Table 1)

The evaluation results are listed in Table 2.

Test Example 4

<Measurement of Light Transmittance>

The first release sheet R and the second release sheet R' were released from the protective film forming sheet $RP_0R'$ obtained in the examples and the comparative examples, and then the protective film forming film $P_0$ was prepared.

The second release sheet R' was released from the protective film forming sheet $RP_0R'$ obtained in the examples and the comparative examples and heated in an oven at 130° C. for 2 hours in an air atmosphere, and the protective film forming film $P_0$ was thermally cured to obtain the protective film $P_1$. Subsequently, the first release sheet R was released, and the protective film $P_1$ was prepared.

The surface of the adhesive layer of the dicing sheet D ("Adwill D-821HS," manufactured by Lintec Corporation) was adhered to the surface of the protective film forming film $P_0$ of the laminate obtained by releasing the second release sheet R' from the protective film forming sheet $RP_0R'$ obtained in the examples and the comparative examples, thereby preparing a laminate $[P_0D]$.

The second release sheet R' was released from the protective film forming sheet $RP_0R'$ obtained in the examples and the comparative examples and heated in an oven at 130° C. for 2 hours in an air atmosphere, and the protective film forming film $P_0$ was thermally cured to obtain the protective film $P_1$. Thereafter, the first release sheet R was released therefrom, and the surface of the adhesive layer side of the dicing sheet D ("Adwill D-821HS," manufactured by Lintec Corporation) was adhered to the surface of the protective film $P_1$, thereby preparing a laminate $P_1D$.

The light transmittances of the protective film forming film P0, the protective film $P_1$, the laminate $[P_0D]$, and the laminate $P_1D$ prepared in the above-described manner were measured using a spectrophotometer (UV-VIS-NIR SPECTROPHOTOMETER UV-3600, manufactured by SHIMADZU Corporation) and the light transmittance (unit: %) at a wavelength of 1064 nm was extracted. An attached large sample chamber MPC-3100 was used for measurement and the measurement was carried out using a built-in integrating sphere. The results are listed in Table 2.

Test Example 5

<Evaluation of Division Processability of Wafer>

(Test Example 5-1) Case where Target to be Irradiated with Laser is Laminate $SP_0$ The protective film forming film $P_0$ which was cut-processed in the same shape as the shape of a silicon wafer S was adhered to the silicon wafer S having a thickness of 100 μm and an outer diameter of 8 inches on a table heated at 70° C. using a sticking device ("RAD-3600 F/12," manufactured by Lintec Corporation), and then a laminate $SP_0$ of the silicon wafer S and the protective film forming film $P_0$ was obtained.

The silicon wafer S was irradiated with laser, which was focused on the inside of the silicon wafer S, from the protective film forming film $P_0$ side of the obtained laminate $SP_0$ while scanning along a scheduled cutting line set so as to form a chip body having a dimension of 9 mm×9 mm using a laser irradiation device ("DFL 7360," manufactured by DISCO Corporation, wavelength of laser: 1064 nm), thereby forming a modified layer in the inside of the silicon wafer S.

A dicing sheet D ("Adwill D-821HS," manufactured by Lintec Corporation) was adhered to the protective film forming film $P_0$ side of the laminate $SP_0$ including the silicon wafer S having a modified layer formed therein, obtained in the above-described manner, using a sticking device ("RAD-2700 F/12," manufactured by Lintec Corporation), and then a laminate $SP_0D$ of the silicon wafer S having a modified layer formed therein, the protective film forming film $P_0$, and the dicing sheet D was obtained in a state of being fixed to a ring frame.

The obtained laminate $SP_0D$ was expanded in a state in which the temperature of the laminate $SP_0D$ was maintained at 0° C. under the conditions of a drawdown speed of 100 mm/sec and an expansion amount of 10 mm using an expanding device ("DDS2300," manufactured by DISCO Corporation). As a result, at least a part of the silicon wafer S was divided along a scheduled dividing line, thereby obtaining a plurality of chips.

The division properties were evaluated based on the following criteria using a third division ratio (unit: %) that is a ratio of the number of chips obtained in the case where the silicon wafer S was cut along the scheduled cutting line of the entire silicon wafer S to the number of chips obtained through actual division by performing the above-described process without setting the presence or absence of division of the protective film or the like (the protective film forming film $P_0$ or the protective film $P_1$) as a target for evaluation.

The third division ratio was 100%: the division properties were excellent ("A" in Table 1)

The third division ratio was 95% or greater and less than 100%: the division properties were good ("B" in Table 1)

The third division ratio was 80% or greater and less than 95%: the division properties were acceptable ("C" in Table 1)

The third division ratio was less than 80%: the division properties were not acceptable ("D" in Table 1)

The evaluation results are listed in the columns of "Laminate $SP_0$" of Table 2.

(Test Example 5-2) Case where Target to be Irradiated with Laser is Laminate $SP_1$ The protective film forming film $P_0$ which was cut-processed in the same shape as the shape of a silicon wafer S was adhered to the silicon wafer S having a thickness of 100 μm and an outer diameter of 8 inches on a table heated at 70° C. using a sticking device ("RAD-3600 F/12," manufactured by Lintec Corporation), and then a laminate $SP_0$ of the silicon wafer S and the protective film forming film $P_0$ was obtained.

The obtained laminate $SP_0$ was heated at 130° C. for 2 hours in an air atmosphere, and the protective film $P_1$ was formed from the protective film forming film $P_0$, thereby obtaining a laminate $SP_1$ formed of the silicon wafer S and the protective film $P_1$.

The silicon wafer S was irradiated with laser, which was focused on the inside of the silicon wafer S, from the protective film side of the obtained laminate $SP_1$ while scanning along a scheduled cutting line set so as to form a chip body having a dimension of 9 mm×9 mm using a laser irradiation device ("DFL 7360," manufactured by DISCO Corporation, wavelength of laser: 1064 nm), thereby forming a modified layer in the inside of the silicon wafer S.

A dicing sheet D ("Adwill D-821HS," manufactured by Lintec Corporation) was adhered to the protective film $P_1$ side of the laminate $SP_1$ including the silicon wafer S having a modified layer formed therein, obtained in the above-described manner, using a sticking device ("RAD-2700 F/12," manufactured by Lintec Corporation), and then a laminate $SP_1D$ of the silicon wafer S having a modified layer formed therein, the protective film forming film $P_1$, and the dicing sheet D was obtained in a state of being fixed to a ring frame.

The obtained laminate $SP_1D$ was expanded in a state in which the temperature of the laminate $SP_1D$ was maintained at 0° C. under the conditions of a drawdown speed of 100 mm/sec and an expansion amount of 10 mm using an expanding device ("DDS2300," manufactured by DISCO Corporation). As a result, at least a part of the silicon wafer S was divided along a scheduled dividing line, thereby obtaining a plurality of chips.

The same evaluation as in Test Example 5-1 was performed by carrying out the above-described process. The evaluation results are listed in the columns of "Laminate $SP_1$" of Table 2.

(Test Example 5-3) Case where Target to be Irradiated with Laser is Laminate $SP_0D$ The protective film forming film $P_0$ which was cut-processed in the same shape as the shape of a silicon wafer S was adhered to the silicon wafer S having a thickness of 100 μm and an outer diameter of 8 inches on a table heated at 70° C. using a sticking device ("RAD-3600 F/12," manufactured by Lintec Corporation), and then a laminate $SP_0$ of the silicon wafer S and the protective film forming film $P_0$ was obtained.

A dicing sheet D ("Adwill D-821HS," manufactured by Lintec Corporation) was adhered to the protective film $P_0$ side of the laminate $SP_0$ using a sticking device ("RAD-2700 F/12," manufactured by Lintec Corporation), and then a laminate $SP_0D$ of the silicon wafer S, the protective film forming film $P_0$, and the dicing sheet D was obtained in a state of being fixed to a ring frame.

The silicon wafer S was irradiated with laser, which was focused on the inside of the silicon wafer S, from the dicing sheet D side of the obtained laminate $SP_0D$ while scanning along a scheduled cutting line set so as to form a chip body having a dimension of 9 mm×9 mm using a laser irradiation device ("DFL 7360," manufactured by DISCO Corporation, wavelength of laser: 1064 nm), thereby forming a modified layer in the inside of the silicon wafer S included in the laminate $SP_0D$.

The laminate $SP_0D$ including the silicon wafer S having a modified layer formed therein was expanded in a state in which the temperature of the laminate $SP_0D$ was maintained at 0° C. under the conditions of a drawdown speed of 100 mm/sec and an expansion amount of 10 mm using an expanding device ("DDS2300," manufactured by DISCO Corporation). As a result, at least a part of the silicon wafer S was divided along a scheduled dividing line, thereby obtaining a plurality of chips.

The same evaluation as in Test Example 5-1 was performed by carrying out the above-described process. The evaluation results are listed in the columns of "Laminate $SP_0D$" of Table 2.

(Test Example 5-4) Case where Target to be Irradiated with Laser is Laminate $S[P_0D]$ A protective film forming film sheet $[P_0D]$ having a function as a dicing sheet was adhered to the silicon wafer S having a thickness of 100 μm and an outer diameter of 8 inches on a table heated at 70° C. using a sticking device ("RAD-2700 F/12," manufactured by Lintec Corporation), and then a laminate $S[P_0D]$ of the silicon wafer S and the protective film forming film $[P_0D]$ was obtained in a state of being fixed to a ring frame.

The silicon wafer S was irradiated with laser, which was focused on the inside of the silicon wafer S, from the protective film forming sheet $[P_0D]$ side of the obtained laminate $S[P_0D]$ while scanning along a scheduled cutting line set so as to form a chip body having a dimension of 9 mm×9 mm using a laser irradiation device ("DFL 7360," manufactured by DISCO Corporation, wavelength of laser: 1064 nm), thereby forming a modified layer in the inside of the silicon wafer S.

The obtained laminate $S[P_0D]$ was expanded in a state in which the temperature of the laminate $S[P_0D]$ was maintained at 0° C. under the conditions of a drawdown speed of 100 mm/sec and an expansion amount of 10 mm using an expanding device ("DDS2300," manufactured by DISCO Corporation). As a result, at least a part of the silicon wafer S was divided along a scheduled dividing line, thereby obtaining a plurality of chips.

The same evaluation as in Test Example 5-1 was performed by carrying out the above-described process. The evaluation results are listed in the columns of "Laminate S[P$_0$D]" of Table 2.

(Test Example 5-5) Case where Target to be Irradiated with Laser is Laminate SP$_1$D The protective film forming film P$_0$ which was cut-processed in the same shape as the shape of a silicon wafer S was adhered to the silicon wafer S having a thickness of 100 μm and an outer diameter of 8 inches on a table heated at 70° C. using a sticking device ("RAD-3600 F/12," manufactured by Lintec Corporation), and then a laminate SP$_0$ of the silicon wafer S and the protective film forming film P$_0$ was obtained.

The obtained laminate SP$_0$ was heated at 130° C. for 2 hours in an air atmosphere, and the protective film P$_1$ was formed from the protective film forming film P$_0$, thereby obtaining a laminate SP$_1$ formed of the silicon wafer S and the protective film P$_1$.

A dicing sheet D ("Adwill D-821HS," manufactured by Lintec Corporation) was adhered to the protective film P$_1$ side of the laminate SP$_1$ using a sticking device ("RAD-2700 F/12," manufactured by Lintec Corporation), and then a laminate SP$_1$D of the silicon wafer S, the protective film forming film P$_1$, and the dicing sheet D was obtained in a state of being fixed to a ring frame.

The silicon wafer S was irradiated with laser, which was focused on the inside of the silicon wafer S, from the dicing sheet side of the obtained laminate SP$_1$D while scanning along a scheduled cutting line set so as to form a chip body having a dimension of 9 mm×9 mm using a laser irradiation device ("DFL 7360," manufactured by DISCO Corporation, wavelength of laser: 1064 nm), thereby forming a modified layer in the inside of the silicon wafer S. In this manner, the laminate SP$_1$D including the silicon wafer S having a modified layer formed therein was obtained.

The laminate SP$_1$D including the silicon wafer S having a modified layer formed therein was expanded in a state in which the temperature of the laminate SP$_1$D was maintained at 0° C. under the conditions of a drawdown speed of 100 mm/sec and an expansion amount of 10 mm using an expanding device ("DDS2300," manufactured by DISCO Corporation). As a result, at least a part of the silicon wafer S was divided along a scheduled dividing line, thereby obtaining a plurality of chips.

The same evaluation as in Test Example 5-1 was performed by carrying out the above-described process. The evaluation results are listed in the columns of "Laminate SP$_1$D" of Table 2.

TABLE 2

| | | | Example 1 | Example 2 | Example 3 | Example 4 | Example 5 | Example 6 | Example 7 | Example 8 | Example 9 | Comparative Example 1 | Comparative Example 2 |
|---|---|---|---|---|---|---|---|---|---|---|---|---|---|
| Protective film forming film P$_0$ | Breaking stress | MPa | 11 | 11 | 11 | 5 | 6 | 18 | 7 | 8 | 11 | 25 | 25 |
| | Breaking strain | % | 10 | 10 | 10 | 21 | 1 | 10 | 111 | 25 | 10 | 13 | 25 |
| | Breaking stress × breaking strain | Mpa · % | 110 | 110 | 110 | 105 | 6 | 180 | 777 | 200 | 110 | 325 | 625 |
| Protective film P$_1$ | Breaking stress | MPa | 30 | 30 | 30 | 16 | 45 | 22 | 6 | 29 | 30 | 29 | 25 |
| | Breaking strain | % | 4 | 4 | 4 | 2 | 4 | 12 | 2 | 3 | 4 | 15 | 25 |
| | Breaking stress × breaking strain | Mpa · % | 120 | 120 | 120 | 32 | 180 | 264 | 12 | 87 | 120 | 435 | 625 |
| Evaluation of division processability of protective film forming film | First division ratio | | A | A | A | A | A | A | D | C | A | D | D |
| Evaluation of division processability of protective film | Second division ratio | | A | A | A | A | C | D | A | A | A | D | D |
| Transmittance of protective film forming film P$_0$ | | % | 50 | 75 | 89 | 52 | 39 | 61 | 67 | 76 | 24 | 24 | 95 |
| Transmittance of protective film P$_1$ | | | 50 | 75 | 89 | 52 | 39 | 61 | 67 | 76 | 24 | 24 | 95 |
| Transmittance of laminate [P$_0$D] | | | 47 | 72 | 87 | 49 | 36 | 58 | 64 | 74 | 21 | 21 | 92 |
| Transmittance of laminate P$_1$D | | | 47 | 72 | 87 | 49 | 36 | 58 | 64 | 74 | 21 | 21 | 92 |
| Evaluation of division processability of wafer | Laminate SP$_0$ | Third division ratio | B | A | A | B | C | A | A | A | D | D | A |
| | Laminate SP$_1$ | | B | A | A | B | C | A | A | A | D | D | A |

TABLE 2-continued

|  | Example 1 | Example 2 | Example 3 | Example 4 | Example 5 | Example 6 | Example 7 | Example 8 | Example 9 | Comparative Example 1 | Comparative Example 2 |
|---|---|---|---|---|---|---|---|---|---|---|---|
| Laminate SP$_0$D | B | A | A | B | C | A | A | A | D | D | A |
| Laminate S[P$_0$D] | B | A | A | B | C | A | A | A | D | D | A |
| Laminate SP$_1$D | B | A | A | B | C | A | A | A | D | D | A |

As can be understood from Table 2, the protective film forming films laminated on a division-processed workpiece or the protective film forming films of the examples whose breaking index of the protective film is in a range of 1 MPa·% to 250 MPa·% have excellent division processability.

INDUSTRIAL APPLICABILITY

The protective film forming film and the protective film forming sheet according to the present invention can be suitably used to manufacture work products such as a chip, on which a protective film is laminated, from workpieces such as a semiconductor wafer.

REFERENCE SIGNS LIST

1: protective film forming film
2: protective film forming sheet
21: release sheet
3, 3A: protective film forming sheet
4: dicing sheet
41: base material
42: adhesive layer
5: adhesive layer for jig
6: semiconductor wafer
7: ring frame

The invention claimed is:

1. A protective film forming film,
wherein the product of the breaking stress (MPa) measured at a measurement temperature of 0° C. and the breaking strain (unit: %) measured at a measurement temperature of 0° C. in at least one of the protective film forming film and a protective film formed from the protective film forming film is in a range of 1 MPa·% to 250 MPa·%.

2. The protective film forming film according to claim 1, wherein the light transmittance at a wavelength of 1064 nm is 30% or greater.

3. A protective film forming sheet, comprising:
a dicing sheet which includes a base material and an adhesive layer laminated on one surface side of the base material; and
the protective film forming film according to claim 1 which is laminated on the adhesive layer side of the dicing sheet.

4. The protective film forming sheet according to claim 3, wherein the light transmittance at a wavelength of 1064 nm is 30% or greater.

5. A method of manufacturing a work product, comprising:
a first modified layer forming process of forming a modified layer in the inside of a workpiece by irradiating the workpiece with laser beams in the infrared region such that the laser beams are focused on a focal point set in the inside of the workpiece;
a first protective film forming film laminating process of laminating the protective film forming film according to claim 1 on the surface of the workpiece on which the modified layer is formed;
a dividing process of dividing the workpiece by applying a force to the workpiece on which the modified layer is formed to obtain a divided product; and
a protective film forming process of forming a protective film from the protective film forming film,
wherein a work product formed by laminating the protective film on one surface of the divided product is obtained.

6. A method of manufacturing a work product, comprising:
a third modified layer forming process of forming a modified layer in the inside of a workpiece by irradiating the workpiece of a laminated structure, which includes the workpiece, the protective film forming film according to claim 2 which is laminated on one surface of the workpiece, and a dicing sheet laminated on a surface side opposite to a side of the protective film forming film facing the workpiece, with laser beams in the infrared region from the dicing sheet side such that the laser beams are focused on a focal point set in the inside of the workpiece;
a dividing process of dividing the workpiece by applying a force to the workpiece on which the modified layer is formed to obtain a divided product; and
a protective film forming process of forming a protective film from the protective film forming film,
wherein a work product formed by laminating the protective film on one surface of the divided product is obtained.

7. A method of manufacturing a work product, comprising:
a second protective film forming film laminating process of laminating the protective film forming film according to claim 2 on one surface of a workpiece;
a second modified layer forming process of forming a modified layer in the inside of the workpiece by irradiating the workpiece through the protective film forming film with laser beams in the infrared region such that the laser beams are focused on a focal point set in the inside of the workpiece on which the protective film forming film is laminated;
a dividing process of dividing the workpiece by applying a force to the workpiece on which the modified layer is formed to obtain a divided product; and
a protective film forming process of forming a protective film from the protective film forming film,
wherein a work product formed by laminating the protective film on one surface of the divided product is obtained.

8. The method of manufacturing a work product according to claim 5, wherein a first dicing sheet laminating process of laminating the dicing sheet on the protective film forming film laminated on the workpiece is performed before the dividing process.

9. The method of manufacturing a work product according to claim 5, wherein the protective film forming film laminated on the workpiece is in a state in which the dicing sheet is laminated on one surface thereof.

10. The method of manufacturing a work product according to claim 5, wherein the protective film forming process is performed after the dividing process.

11. The method of manufacturing a work product according to claim 5, wherein the dividing process is performed after the protective film forming process.

12. A method of manufacturing a work product, comprising:
- a second protective film forming film laminating process of laminating the protective film forming film according to claim 2 on one surface of a workpiece;
- a protective film forming process of forming a protective film from the protective film forming film;
- a fourth modified layer forming process of forming a modified layer in the inside of the workpiece by irradiating the workpiece through the protective film with laser beams in the infrared region such that the laser beams are focused on a focal point set in the inside of the workpiece on which the protective film is laminated; and
- a dividing process of dividing the workpiece by applying a force to the workpiece on which the modified layer is formed to obtain a divided product,
- wherein a work product formed by laminating the protective film on one surface of the divided product is obtained as a resultant of the dividing process.

13. A method of manufacturing a work product, comprising:
- a second protective film forming film laminating process of laminating the protective film forming film according to claim 2 on one surface of a workpiece;
- a protective film forming process of forming a protective film from the protective film forming film;
- a second dicing sheet laminating process of laminating a dicing sheet on the protective film laminated on the workpiece;
- a fifth modified layer forming process of forming a modified layer in the inside of the workpiece by irradiating the workpiece through the protective film and the dicing sheet with laser beams in the infrared region such that the laser beams are focused on a focal point set in the inside of the workpiece on which the protective film is laminated; and
- a dividing process of dividing the workpiece by applying a force to the workpiece on which the modified layer is formed to obtain a divided product,
- wherein a work product formed by laminating the protective film on one surface of the divided product is obtained as a resultant of the dividing process.

14. A method of manufacturing a work product, comprising:
- a third protective film forming film laminating process of laminating the protective film forming film according to claim 2, in a state in which a dicing sheet is laminated thereon, on one surface of a workpiece;
- a protective film forming process of forming a protective film from the protective film forming film;
- a fifth modified layer forming process of forming a modified layer in the inside of the workpiece by irradiating the workpiece through the protective film and the dicing sheet with laser beams in the infrared region such that the laser beams are focused on a focal point set in the inside of the workpiece on which the protective film is laminated; and
- a dividing process of dividing the workpiece by applying a force to the workpiece on which the modified layer is formed to obtain a divided product,
- wherein a work product formed by laminating the protective film on one surface of the divided product is obtained as a resultant of the dividing process.

15. The protective film forming film according to claim 1, wherein the breaking strain (unit: %) measured at the measurement temperature of 0° C. is in a range of 2% to 25%.

* * * * *